(12) United States Patent
Lou et al.

(10) Patent No.: US 11,876,112 B2
(45) Date of Patent: Jan. 16, 2024

(54) DISPLAY PANEL AND SPLICED DISPLAY DEVICE

(71) Applicant: Shanghai Tianma Micro-Electronics Co., Ltd., Shanghai (CN)

(72) Inventors: Tenggang Lou, Shanghai (CN); Ximin Qi, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 18/190,616

(22) Filed: Mar. 27, 2023

(65) Prior Publication Data
US 2023/0307489 A1 Sep. 28, 2023

(30) Foreign Application Priority Data
Nov. 29, 2022 (CN) .......................... 202211509616.2

(51) Int. Cl.
*H01L 27/15* (2006.01)
*G09G 3/32* (2016.01)

(52) U.S. Cl.
CPC ............. *H01L 27/156* (2013.01); *G09G 3/32* (2013.01); *G09G 2300/0426* (2013.01); *G09G 2300/0819* (2013.01); *G09G 2300/0852* (2013.01); *G09G 2310/0286* (2013.01); *G09G 2310/08* (2013.01)

(58) Field of Classification Search
CPC H01L 27/156; G09G 3/32; G09G 2300/0426; G09G 2300/0819; G09G 2300/0852; G09G 2310/0286; G09G 2310/08
See application file for complete search history.

(56) References Cited

U.S. PATENT DOCUMENTS

2020/0411602 A1* 12/2020 Zhao ................... H10K 59/121

FOREIGN PATENT DOCUMENTS

CN 113223420 A 8/2021

* cited by examiner

*Primary Examiner* — Abbas I Abdulselam
(74) *Attorney, Agent, or Firm* — CHRISTENSEN O'CONNOR JOHNSON KINDNESS PLLC

(57) ABSTRACT

Provided are a display panel and a spliced display device. The display panel includes pixel rows and spacing areas. The pixel rows include a type-A pixel row adjacent to a first panel edge and type-B pixel rows including a first type-B pixel row. The spacing areas correspond to and are adjacent to the type-B pixel rows, and close to the first panel edge. The pixel row includes light-emitting devices and pixel circuits. The pixel circuit includes a first part and a second part. In the type-A pixel row, the first part is located at a side of the light-emitting device close to the first panel edge, and the second part is located in the spacing area corresponding to the first type-B pixel row. In at least one type-B pixel row, the pixel circuit is located at a side of the light-emitting device close to the first panel edge.

20 Claims, 23 Drawing Sheets

DISPLAY PANEL AND SPLICED DISPLAY DEVICE

CROSS-REFERENCE TO RELATED APPLICATIONS

The present application claims priority to Chinese Patent Application No. 202211509616.2, filed on Nov. 29, 2022, the content of which is incorporated herein by reference in its entirety.

TECHNICAL FIELD

The present disclosure relates to the display technical field, and particularly, to a display panel and a spliced display device.

BACKGROUND

When display panels having bezels are applied in a spliced display device having a large size, light-emitting areas of adjacent display panels will be separated by a space having a larger width, which leads to an obvious splicing gap formed when the spliced display device displays images, thereby seriously affecting the display effect.

SUMMARY

In a first aspect, the present disclosure provides a display panel. The display panel includes: a first panel edge and a second panel edge that are opposite to each other in a first direction; pixel rows arranged along the first direction and including a type-A pixel row and type-B pixel rows, the type-A pixel row being adjacent to the first panel edge, and the type-B pixel rows including a first type-B pixel row adjacent to the type-A pixel row; and spacing areas corresponding to the type-B pixel rows in a one-to-one correspondence. One spacing area of the spacing areas is adjacent to one type-B pixel row of the type-B pixel rows corresponding to the spacing area and is located at a side of the one type-B pixel row close to the first panel edge. One pixel row of the pixel rows includes light-emitting devices and pixel circuits, the light-emitting devices are arranged in a second direction that intersects with the first direction. The pixel circuits located in the pixel rows include type-A pixel circuits located in the type-A pixel row and type-B pixel circuits located in the type-B pixel rows, and the light-emitting devices located in the pixel rows include type-A light-emitting devices located in the type-A pixel row and type-B light-emitting devices located in the type-B pixel rows. Each of the pixel circuits includes a first part and a second part. In the type-A pixel row, the first part of each of at least one of the type-A pixel circuits is located at a side of the type-A light-emitting devices close to the first panel edge, and the second part of one of the type-A pixel circuits is located in the spacing area that corresponds to the first type-B pixel row. In each of at least one of the type-B pixel rows, the first part and the second part of each of the type-B pixel circuits is located at a side of one of the type-B light-emitting devices close to the first panel edge.

In a second aspect, the present disclosure provides a spliced display device including display panels, each of which includes a first panel edge and a second panel edge that are opposite to each other in a first direction; pixel rows arranged along the first direction and including a type-A pixel row and type-B pixel rows, the type-A pixel row being adjacent to the first panel edge, and the type-B pixel rows including a first type-B pixel row adjacent to the type-A pixel row; and spacing areas corresponding to the type-B pixel rows in a one-to-one correspondence. One spacing area of the spacing areas is adjacent to one type-B pixel row of the type-B pixel rows corresponding to the spacing area and is located at a side of the one type-B pixel row close to the first panel edge. One pixel row of the pixel rows includes light-emitting devices and pixel circuits, the light-emitting devices are arranged in a second direction that intersects with the first direction. The pixel circuits located in the pixel rows include type-A pixel circuits located in the type-A pixel row and type-B pixel circuits located in the type-B pixel rows, and the light-emitting devices located in the pixel rows include type-A light-emitting devices located in the type-A pixel row and type-B light-emitting devices located in the type-B pixel rows. Each of the pixel circuits includes a first part and a second part. In the type-A pixel row, the first part of each of at least one of the type-A pixel circuits is located at a side of the type-A light-emitting devices close to the first panel edge, and the second part of one of the type-A pixel circuits is located in the spacing area that corresponds to the first type-B pixel row. In each of at least one of the type-B pixel rows, the first part and the second part of each of the type-B pixel circuits is located at a side of one of the type-B light-emitting devices close to the first panel edge. At least two of the display panels are spliced together along the first direction.

BRIEF DESCRIPTION OF DRAWINGS

For clearly describing embodiments of the present disclosure and embodiments in the related art, accompanying drawings helpful for illustrating these embodiments are briefly introduced as below. The accompanying drawings described below illustrate some embodiments of the present disclosure. Based on these drawings, those skilled in the art can obtain other drawings.

DESCRIPTION OF EMBODIMENTS

In order to better illustrate technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiment, rather than limiting the present disclosure. The terms "a", "an", "the" and "the" in a singular form in some embodiments of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate A alone, both A and B, and B alone. In addition, the symbol "/" in the context generally indicates that the relation between the objects in front and at the back of "/" is an "or" relationship.

Embodiments of the present disclosure provide a display panel, which can be a light-emitting diode (LED) display panel, such as, a mini LED display panel or a micro LED display panel.

Figure 1:
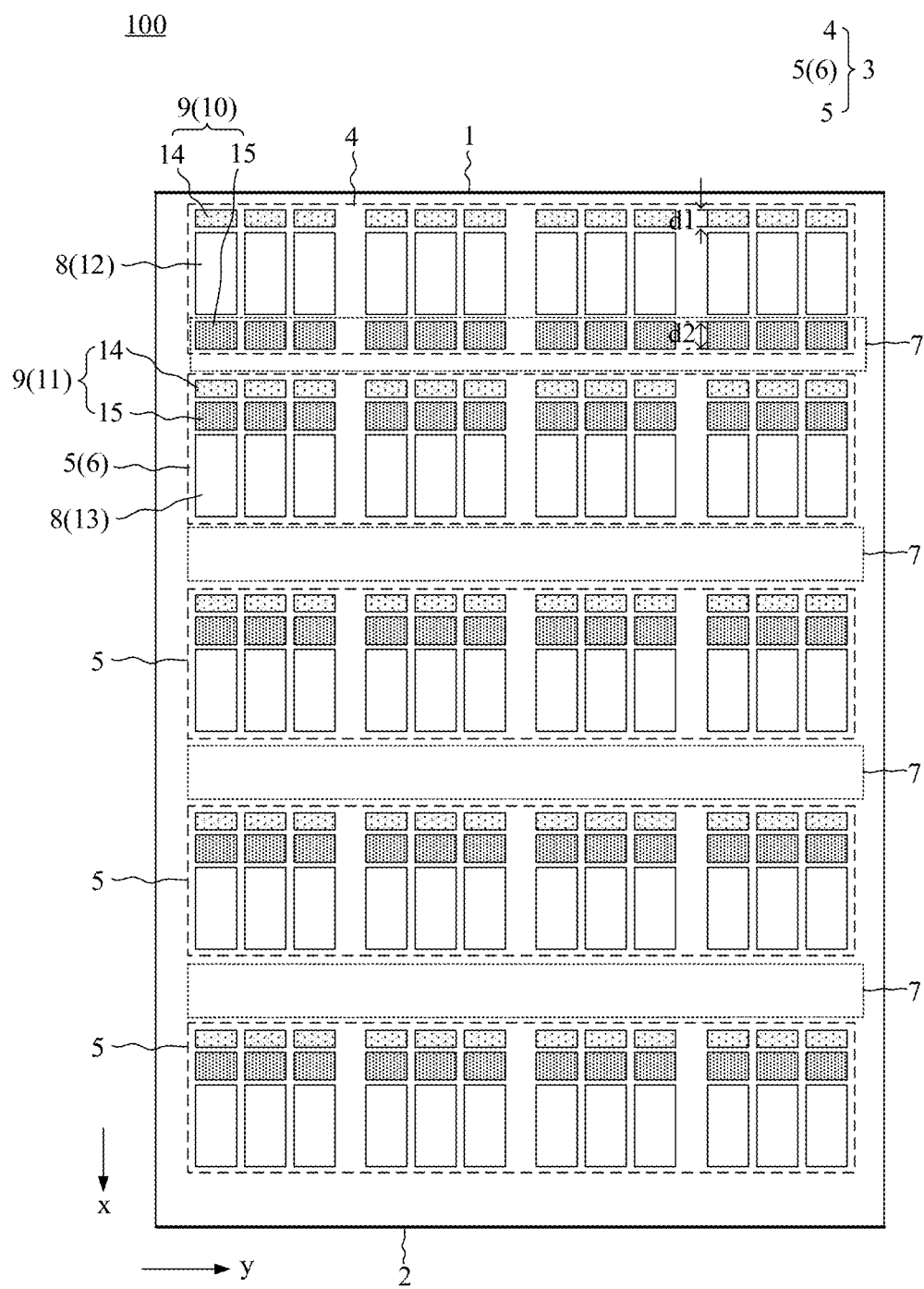
FIG. 1 is a top view of a display panel provided by some embodiments of the present disclosure.

FIG. 1 is a top view of a display panel 100 provided in some embodiments of the present disclosure. As shown in FIG. 1, the display panel 100 includes a first panel edge 1 and a second panel edge 2 that are opposite to each other along a first direction x. The display panel 100 further includes multiple pixel rows 3 arranged along the first direction x, and the multiple pixel rows 3 include a type-A pixel row 4 and multiple type-B pixel rows 5. The type-A pixel row 4 is adjacent to the first panel edge 1, and the multiple type-B pixel rows 5 include a first type-B pixel row 6 adjacent to the type-A pixel row 4. That is, the type-A pixel row 4 is a pixel row 3 closest to the first panel edge 1, and the first type-B pixel row 6 is a pixel row 3 closest to the type-A pixel row 4.

The display panel 100 has multiple spacing areas 7 corresponding to the multiple type-B pixel rows 5 in one-to-one correspondence. Each spacing area 7 is adjacent to one type-B pixel row 5 corresponding to the spacing area 7, and is located at a side of the corresponding type-B pixel row 5 close to the first panel edge 1.

The pixel row 3 includes multiple light-emitting devices 8 and multiple pixel circuits 9, and the multiple light-emitting devices 8 in the pixel row 3 are arranged along the second direction y. The light-emitting devices 8 can be mini LEDs or micro LEDs, and the second direction y intersects with the first direction x.

The pixel circuits 9 include a type-A pixel circuit 10 located in the type-A pixel row 4 and a type-B pixel circuit 11 located in the type-B pixel row 5, and the light-emitting devices 8 include a type-A light-emitting device 12 located in the type-A pixel row 4 and a type-B light-emitting device 13 located in the type-B pixel row 5.

The pixel circuit 9 includes a first part 14 and a second part 15. In the type-A pixel row 4, the first part 14 of at least one type-A pixel circuit 10 is located at a side of the type-A light-emitting device 12 close to the first panel edge 1, and the second part 15 of at least one type-A pixel circuit 10 is located in the spacing area 7 corresponding to the first type-B pixel row 6. In at least one type-B pixel row 5, the first part 14 and the second part 15 of the type-B pixel circuit 11 are located at a side of the type-B light-emitting device 13 close to the first panel edge 1.

It can be understood that the first panel edge 1 and second panel edge 2 are two cut edges of the display panel 100 opposite to each other in the first direction x, that is, the two outermost edges of the display panel 100. In the embodiments of the present disclosure, a part of a bezel between the first panel edge 1 and the type-A light-emitting devices 12 in the type-A pixel row 4 is referred to as an upper bezel, and a part of the bezel between the second panel edge 2 and the type-B light-emitting devices 13 in the type-B pixel row 5 closest to the second panel edge 2 is referred to as a lower bezel.

In a conventional structure design of the display panel 100, the pixel circuits 9 in different pixel rows 3 are arranged in a same manner, the pixel circuits 9 in each pixel row 3 are located at a side of the light-emitting devices 8 in the pixel row 3 close to the first panel edge 1. As a result, the type-A light-emitting devices 12 in the type-A pixel row 4 are spaced apart from the first panel edge 1 by at least a complete type-A pixel circuit 10, making the upper bezel have a larger width. When the number of devices in the pixel circuit 9 is large or the devices in pixel circuit 9 have large design sizes, the type-A pixel circuit 10 occupies a large space, and the upper bezel has a large width. When the display panel 100 is applied in a spliced display device, an obvious visual splicing gap is formed.

In the embodiments of the present disclosure, the pixel circuit 9 includes the first part 14 and the second part 15, and the second part 15 of the type-A pixel circuit 10 is moved from the side of the first light-emitting device 8 close to the first panel edge 1 (hereinafter referred to as an outer side of the first light-emitting device 8) to the spacing area 7 located at a side of the first light-emitting device 8 away from the first panel edge 1 (hereinafter referred to as an inner side of the first light-emitting device 8), which is equivalent to reducing the space that would be occupied by the second part 15 of the type-A pixel circuit 10 at the outside of the first light-emitting device 8. In this way, the width of the upper bezel occupied by the type-A pixel circuit 10 is reduced, and thus, when cutting the display panel 100, a distance between the cutting line (the first panel edge 1) corresponding to the upper bezel and the type-A pixel row 4 can be adjusted so that the distance is reduced, and thus the upper bezel of the display panel 100 can be narrowed, for example, the width of the upper bezel of the display panel 100 is significantly smaller than the width of the lower bezel of the display panel 100.

Figure 2:
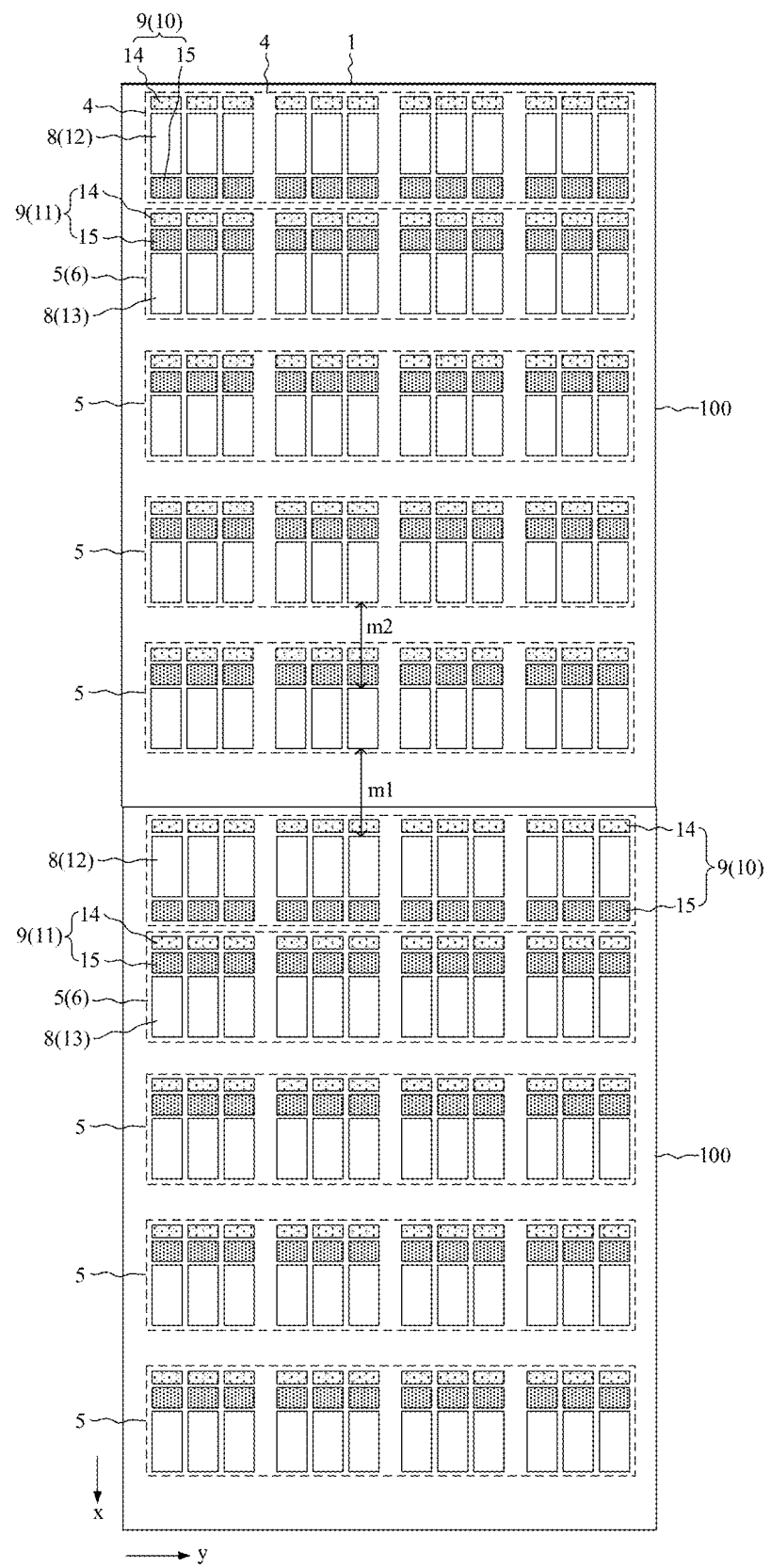
FIG. 2 is a top view of a spliced display device provided by some embodiments of the present disclosure.

FIG. 2 is a top view of the spliced display device provided by embodiments of the present disclosure. As shown in FIG. 2, when the display panel 100 is applied in a spliced display device after narrowing the upper bezel of the display panel 100, for two display panels 100 adjacent in the first direction, a sum of a width of the lower bezel of the former display panel 100 and a width of the upper bezel of the latter display panel 100 can be reduced, that is, a difference between a spacing m1 between the type-B light-emitting device 13 in the last type-B pixel row 5 in the former display panel 100 and the type-A light-emitting device 12 in the type-A pixel row 4 in the latter display panel 100 and a spacing m2 between the light-emitting devices 8 in any other two adjacent pixel rows 3. In this way, the light-emitting devices 8 in the entire spliced display device tend to be equally spaced apart from each other, thereby weakening the visual splicing gap to achieve seamless splicing between the display panels 100.

According to the embodiments of the present disclosure, the visual splicing gap is weakened by narrowing the upper bezel, while the lower bezel still maintains its original width, so that an enough space can be reserved to arrange the pins and fan-out lines in the lower bezel.

When the two parts of the type-A pixel circuit 10 are arranged at two sides of the type-A light-emitting device 12, the two parts can each have a large accommodation space, and the design size of the transistor in the type-A pixel circuit 10 can be increased, such as increasing a width-to-length ratio of the driver transistor in the type-A pixel circuit 10. Therefore, a driving current converted by the type-A pixel circuit 10 can be increased, thereby increasing the light-emitting brightness of the type-A light-emitting device 12.

In some embodiments of the present disclosure, the multiple spacing areas 7 have a same width in the first direction x, so that the light-emitting devices 8 in different pixel rows 3 in the display panel 100 can be equally spaced apart from each other.

In some embodiments, referring to FIG. 1 again, a size d1 of the first part 14 in the type-A pixel row 4 in the first direction x is smaller than a size d2 of the second part 15 in the type-A pixel row 4 in the first direction x, thereby reducing the space occupied by the first part 14 of the type-A pixel circuit 10 at the outside of the first light-emitting device 8 (close to the first panel edge 1), to provide a larger width of the upper bezel and thus reduce the difference between m1 and m2 to a greater extent.

In some embodiments, the number of devices in the first part 14 in the type-A pixel row 4 is smaller than the number of devices in the second part 15 in the type-A pixel row 4, thereby achieving a smaller size of the first part 14 in the first direction x.

Figure 3:
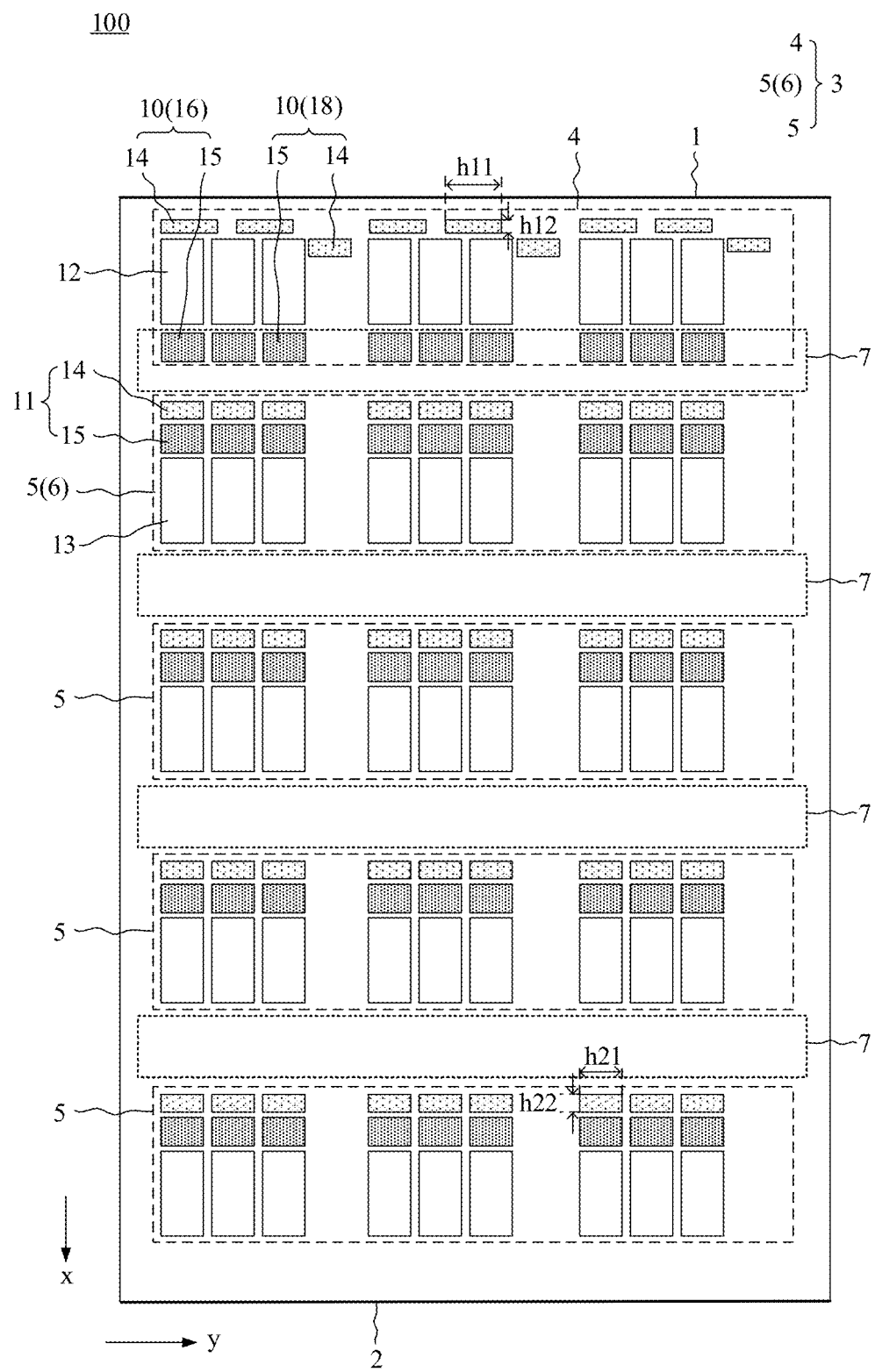
FIG. 3 is another top view of a display panel provided by some embodiments of the present disclosure.

FIG. 3 is another top view of the display panel 100 provided in some embodiments of the present disclosure. In some embodiments, as shown in FIG. 3, the type-A pixel circuits 10 include a first type-A pixel circuit 16, and the first part 14 of the first type-A pixel circuit 16 is located at a side of the type-A light-emitting device 12 close to the first panel edge 1. A size h11 of the first part 14 of the first type-A pixel circuit 16 in the second direction y is larger than a size h21 of the first part 14 of the type-B pixel circuit 11 in the second direction y. A size h12 of the first part 14 of the first type-A pixel circuit 16 in the first direction x is smaller than a size h22 of the first part 14 of the type-B pixel circuit 11 in the first direction x.

Compared with the first part 14 of the type-B pixel circuit 11, the above-mentioned configuration can reduce the size of the first part 14 of the first type-A pixel circuit 16 in the first direction x by elongating the size of the first part 14 of the first type-A pixel circuit 16 in the second direction y. In this way, the first part 14 of the first type-A pixel circuit 16 occupies a smaller width of the upper bezel, so that the first panel edge 1 and the type-A light-emitting device 12 can be closer to each other.

Figure 4:
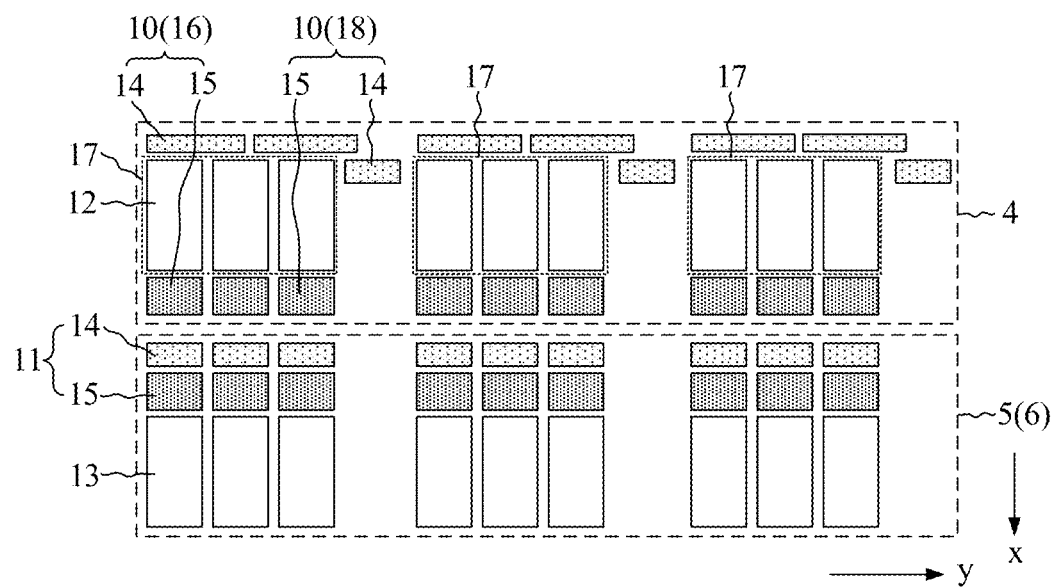
FIG. 4 is a partial top view of a display panel provided by some embodiments of the present disclosure.

FIG. 4 is a partial top view of the display panel 100 provided in some embodiments of the present disclosure. In some embodiments, referring to FIG. 3 and FIG. 4, the pixel row 3 includes multiple light-emitting device groups 17 arranged along the second direction y. The light-emitting device group 17 includes at least two light-emitting devices 8 arranged along the second direction y, for example, the light-emitting device group 17 includes three light-emitting devices 8 arranged along the second direction y, and the three light-emitting devices 8 are configured to emit red light, green light and blue light, respectively. A distance between two adjacent light-emitting device groups 17 is greater than a distance between two adjacent light-emitting devices 8 in the light-emitting device group 17.

The type-A pixel circuits 10 can also include a second type-A pixel circuit 18, and a first part 14 of the second type-A pixel circuit 18 is located between adjacent light-emitting device groups 17 in in the pixel row 3.

Based on the above-mentioned structure, the first part 14 of at least one type-A pixel circuit 10 is located between adjacent light-emitting device groups 17, and the first part 14 of another at least one type-A pixel circuit 10 is located outside of the type-A light-emitting devices 12. In this case, a size, in the first direction x, of the first part 14 outside of the type-A light-emitting device 12 can be reduced by elongating the size of the first part 14 outside of the type-A light-emitting device 12 in the second direction y, thereby reducing the width of the first part 14 of the first type-A pixel circuit 16 outside of the type-A light-emitting device 12 to narrow the upper bezel.

Figure 5:
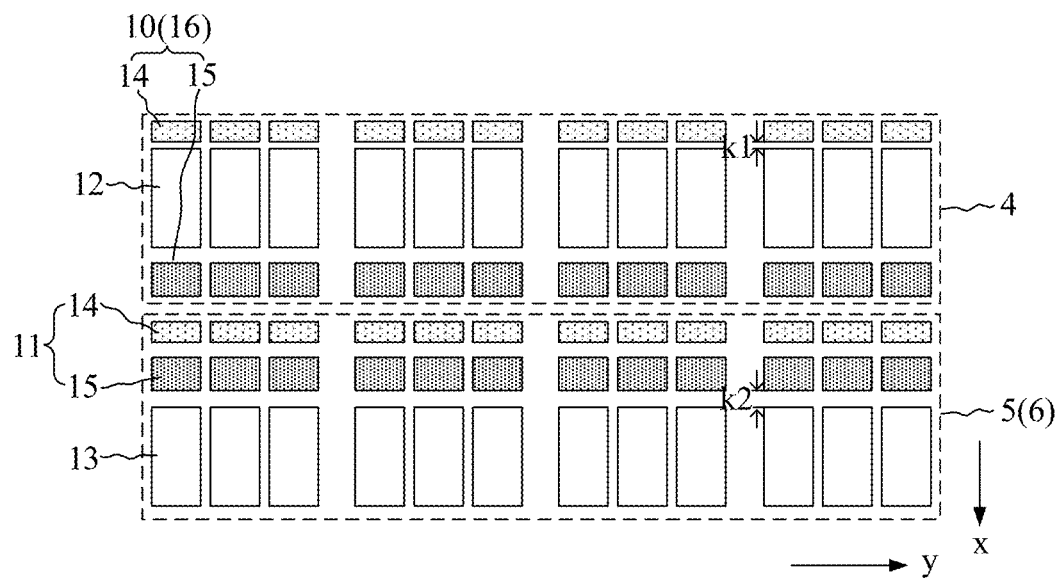
FIG. 5 is another partial top view of a display panel provided by some embodiments of the present disclosure.

FIG. 5 is another partial top view of the display panel 100 provided in some embodiments of the present disclosure. In some embodiments, as shown in FIG. 5, the type-A pixel circuit 10 includes a first type-A pixel circuit 16, and the first part 14 of the first type-A pixel circuit 16 is disposed at a side of the type-A light-emitting device 12 close to the first panel edge 1.

A distance k1 between the first part 14 of the first type-A pixel circuit 16 and the type-A light-emitting device 12 is smaller than a distance k2 between the type-B pixel circuit 11 and the type-B light-emitting device 13, so that the first part 14 of the first type-A pixel circuit 16 is closer to the type-A light-emitting device 12. In this way, a larger cutting width of the upper edge can be achieved, and a risk of the first part 14 of the pixel circuit 16 being damaged during the cutting process can be reduced.

Figure 6:
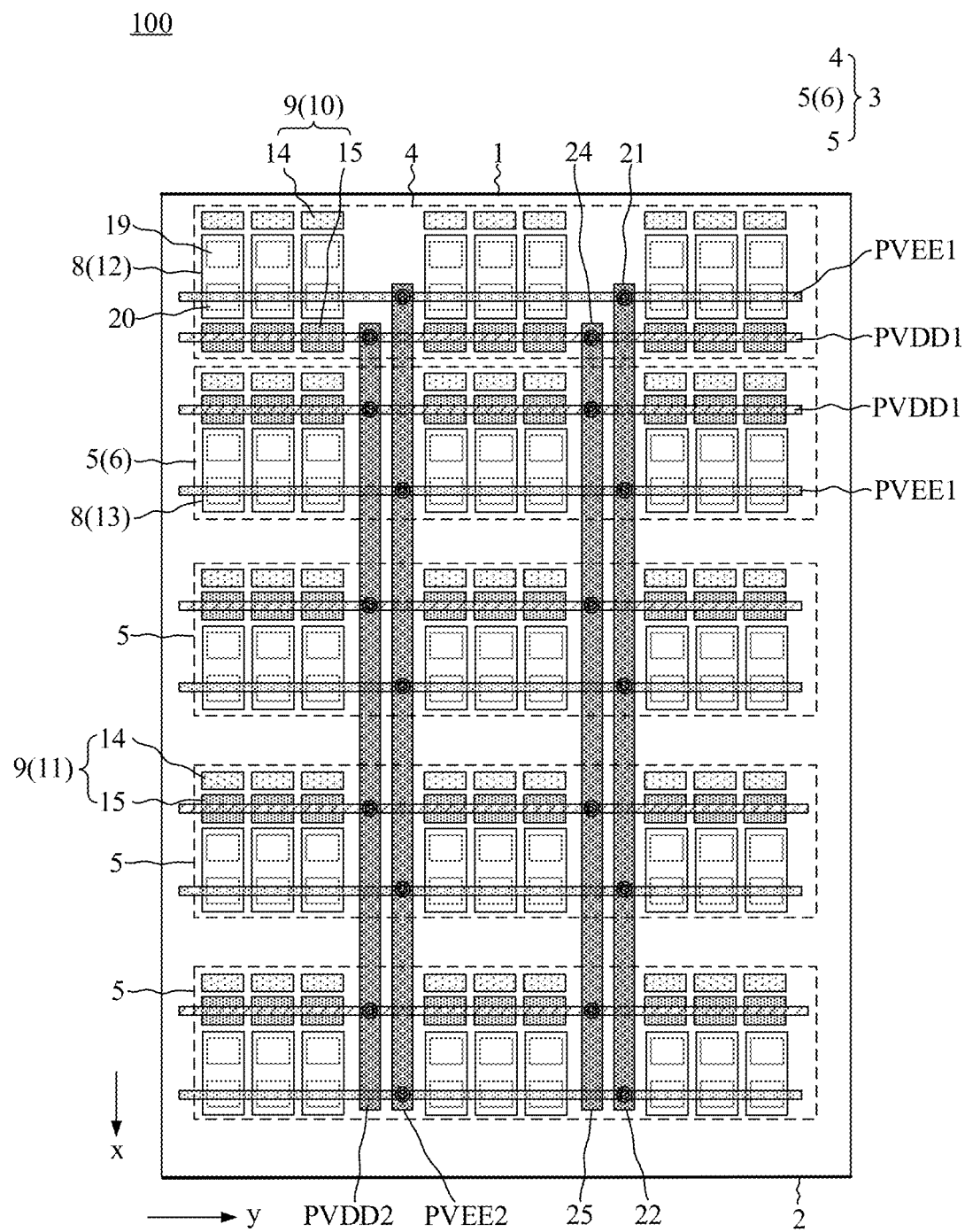
FIG. 6 is another top view of a display panel provided by some embodiments of the present disclosure.
Figure 7:
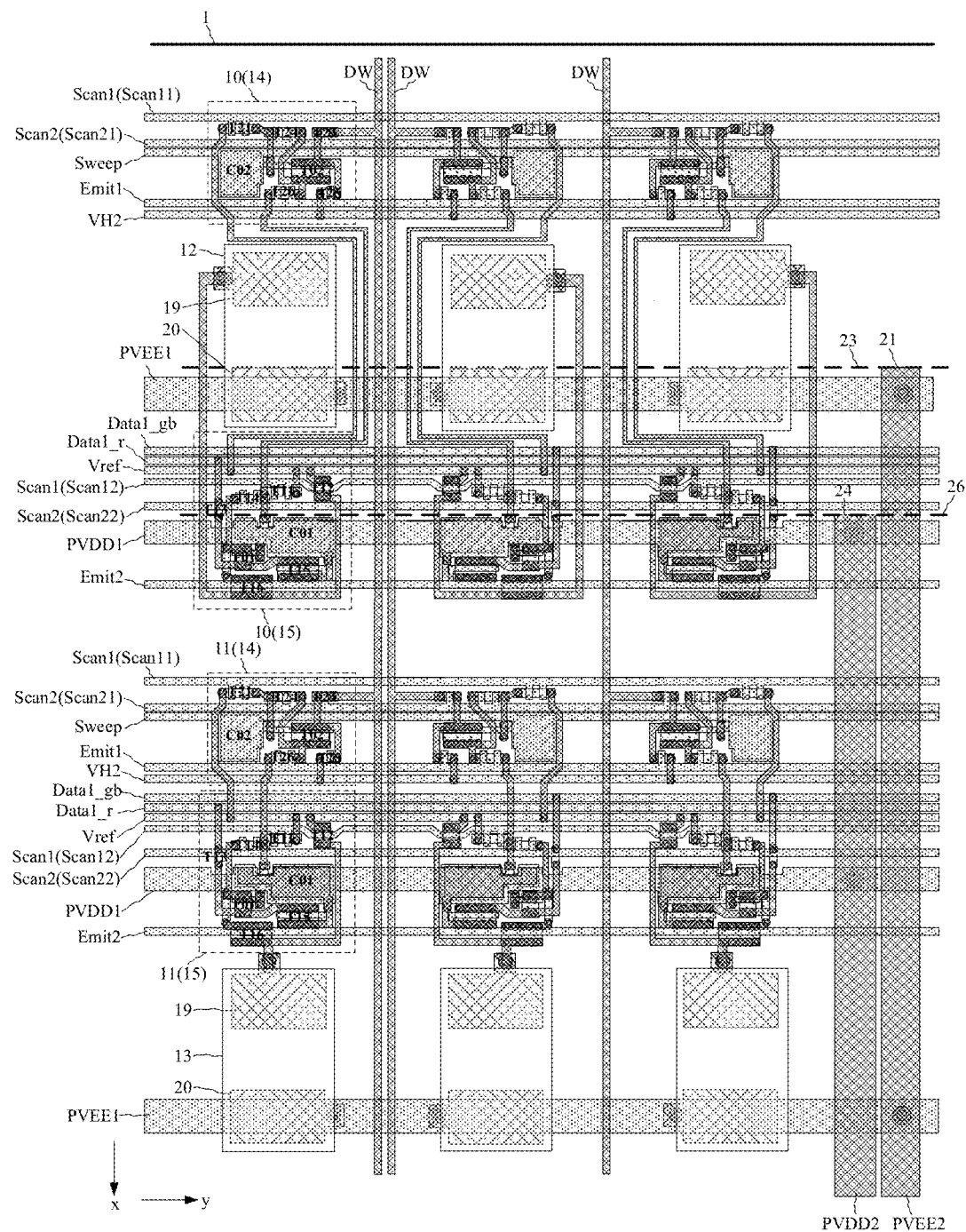
FIG. 7 is a layer schematic diagram of a display panel provided by some embodiments of the present disclosure.

FIG. 6 is another top view of a display panel 100 provided by some embodiments of the present disclosure. FIG. 7 is a layer schematic diagram of a display panel 100 provided by some embodiments of the present disclosure. In some embodiments, as shown in FIG. 6 and FIG. 7, the light-emitting device 8 includes an anode 19 and a cathode 20 arranged along the first direction x.

The display panel 100 includes a first negative power signal line PVEE1 extending along the second direction y and a second negative power signal line PVEE2 extending along the first direction x. The first negative power signal line PVEE1 is electrically connected to the cathode 20, and the first negative power signal line PVEE1 overlaps with the cathode 20 in a direction perpendicular to a plane of the display panel 100. The second negative power signal line PVEE2 is electrically connected to the first negative power signal line PVEE1, and the second negative power signal line PVEE2 includes a first line edge 21 and a second line edge 22 that are opposite to each other in the first direction x. The first line edge 21 is close to the first panel edge 1, and an extension line 23 of the first line edge 21 extending along the second direction y is located at a side of the anode 19 of the type-A light-emitting device 12 away from the first panel edge 1.

On the one hand, the first negative power signal lines PVEE1 and the second negative power signal lines PVEE2 cross each other to form a grid-like structure, thereby reducing an overall line load of the negative power signal lines, and thus reducing a voltage drop of the negative power signal in the transmission process. On the other hand, when designing the second negative power signal line PVEE2, under a premise that the second negative power signal line PVEE2 is electrically connected to each first negative power signal line PVEE1, the extension line 23 of the first line edge 21 of the second negative power signal line PVEE2 is located at a side of the anode 19 of the type-A light-emitting device 12 away from the first panel edge 1, so that the second negative power signal line PVEE2 does not extend near the first panel edge 1, and a space between the first line edge 21 of the second negative power signal line PVEE2 and the first panel edge 1 can be reserved for arranging some devices of the type-A pixel circuit 10 or other functional devices. In this way, the device that would otherwise be arranged in the upper bezel can be moved to the display area, thereby being beneficial to narrowing the upper bezel and thus weakening the visual splicing gap of the spliced display device.

In some embodiments, referring to FIG. 6 and FIG. 7 again, the display panel 100 includes a first positive power signal line PVDD1 extending in the second direction y and a second positive power signal line PVDD2 extending in the first direction x.

The first positive power signal line PVDD1 is electrically connected to the second part 15, and the first positive power signal line PVDD1 overlaps with the second part 15 in the direction perpendicular to the plane of the display panel 100.

The second positive power signal line PVDD2 is electrically connected to the first positive power signal line PVDD1, and the second positive power signal line PVDD2 includes a third line edge 24 and a fourth line edge 25 that are opposite to each other in the first direction x. The third line edge 24 is close to the first panel edge 1, and an extension line 26 of the third line edge 24 extending along the second direction y is located at a side of the type-A light-emitting device 12 away from the first panel edge 1.

The first positive power signal line PVDD1 and the second positive power signal line PVDD2 have configurations similar to the first negative power signal line PVEE1 and the second negative power signal line PVEE2. In this way, an overall line load of the positive power signal lines can be reduced, a apace between the third line edge 24 of the second positive power signal line PVDD2 and the first panel edge 1 can be reserved for arranging some devices of the type-A pixel circuit 10 or other functional devices.

Figure 8:
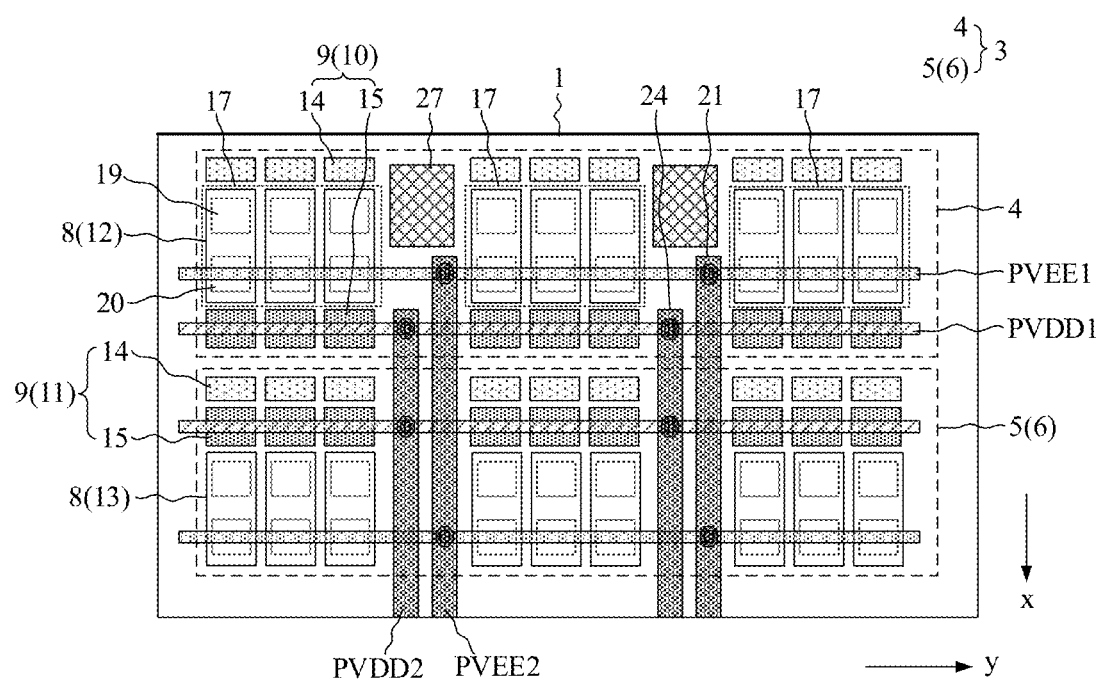
FIG. 8 is another partial top view of a display panel provided by some embodiments of the present disclosure.

FIG. 8 is another partial top view of the display panel 100 provided by some embodiments of the present disclosure. In some embodiments, as shown in FIG. 8, the pixel row 3 includes multiple light-emitting device groups 17 arranged along the second direction y, and the light-emitting device group 17 includes at least two light-emitting devices 8 arranged along the second direction y. A distance between two adjacent light-emitting device groups 17 is greater than a distance between two adjacent light-emitting devices 8 in the light-emitting device group 17.

The second positive power signal line PVDD2 extends between adjacent light-emitting device groups 17.

The display panel 100 also includes a functional module 27, at least one functional module 27 is located between adjacent light-emitting device groups 17 and is also located between the first panel edge 1 and an extension line 26 of the third line edge 24 extending along the second direction y.

As mentioned above, based on the configurations of the first positive power signal line PVDD1 and the second positive power signal line PVDD2, a space between the second positive power signal line PVDD2 and the first panel edge 1 is reserved for arranging at least one function module 27, thereby not only achieving reasonable usage of the space, but also avoiding that the at least one function module 27 occupies the space on the upper bezel.

In some embodiments, in order to enable the display panel to achieve functions such as electrostatic protection and light sensing detection, the function module 27 can include an electrostatic protection circuit and/or a sensor.

Figure 9:
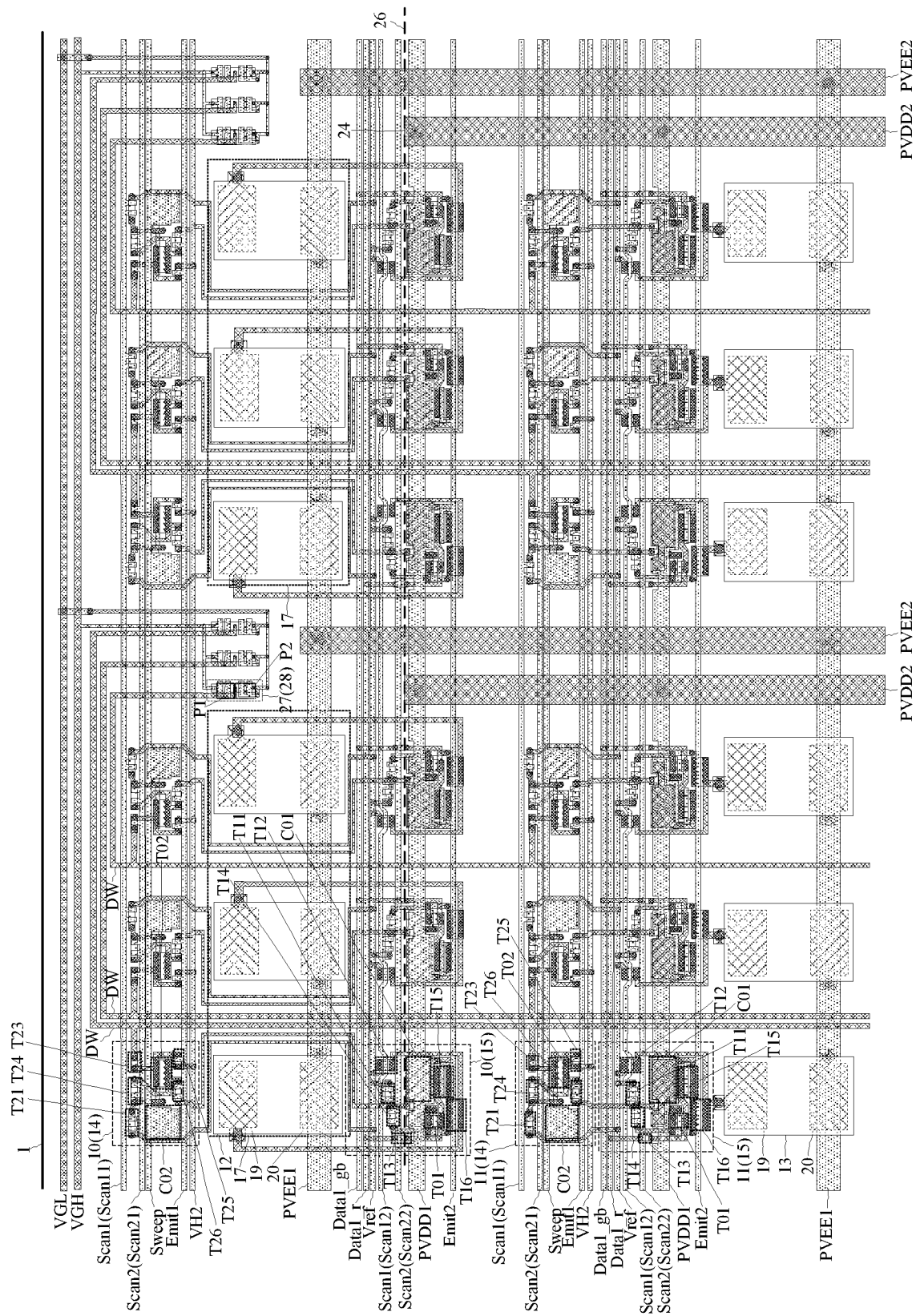
FIG. 9 is another layer schematic diagram of a display panel provided by some embodiments of the present disclosure.
Figure 10:
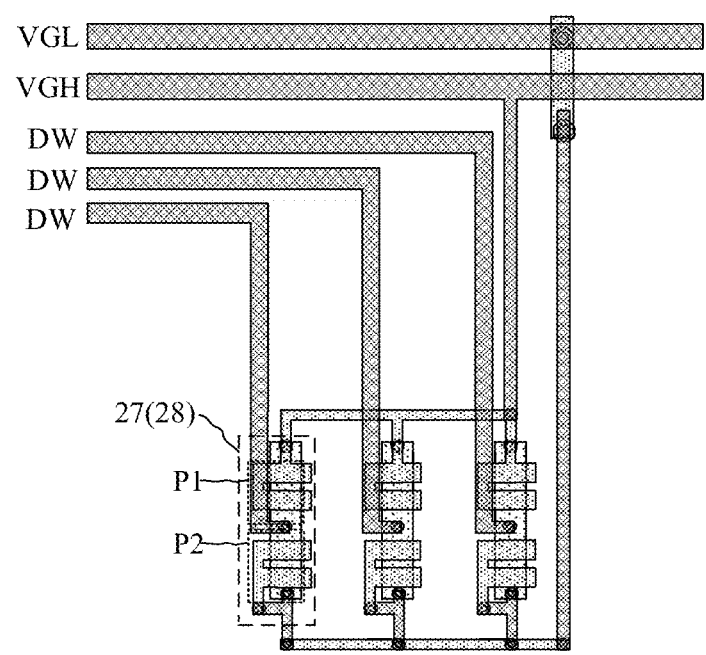
FIG. 10 is a layer schematic diagram of an electrostatic protection circuit provided by some embodiments of the present disclosure.

FIG. 9 is a layer schematic diagram of the display panel 100 provided by some embodiments of the present disclosure, and FIG. 10 is a layer schematic diagram of the electrostatic protection circuit provided by some embodiments of the present disclosure. In some embodiments, as shown in FIG. 9, the functional module 27 includes an electrostatic protection circuit 28. The electrostatic protection circuit 28 can include a first protection transistor P1 and a second protection transistor P2. The first protection transistor P1 is a P-type transistor, and a gate and a first electrode of the first protection transistor P1 are electrically connected to a first fixed-potential signal line VGH. The second protection transistor P2 is an n-type transistor, and a gate and a first electrode of the second protection transistor P2 are electrically connected to a second fixed-potential signal line VGL. When the pixel circuit 9 adopts the circuit structure shown in FIG. 20, a second electrode of the first protection transistor P1 and a second electrode of the second protection transistor P2 are electrically connected to a variable-voltage data line DW, and when the pixel circuit 9 adopts the circuit structure shown in FIG. 23, the second electrode of the first protection transistor P1 and the second electrode of the second protection transistor P2 are electrically connected to a data writing line Data2. FIG. 10 is an illustration where the second electrode of the first protection transistor P1 and the second electrode of the second protection transistor P2 are electrically connected to a variable-voltage data line DW.

In a conventional design, the electrostatic protection circuit 28 is generally provided on the upper bezel of the display panel 100, that is, at the outer side of the type-A pixel row 4. The embodiments of the present disclosure can reduce the space on the upper bezel that would be occupied by the electrostatic protection circuit 28 by arranging the electrostatic protection circuit 28 to be located between the first panel edge 1 and an extension line of the third line edge 24 of the second positive power signal line PVDD2 extending along the second direction y, thereby reducing the cutting width of the upper bezel.

Figure 11:
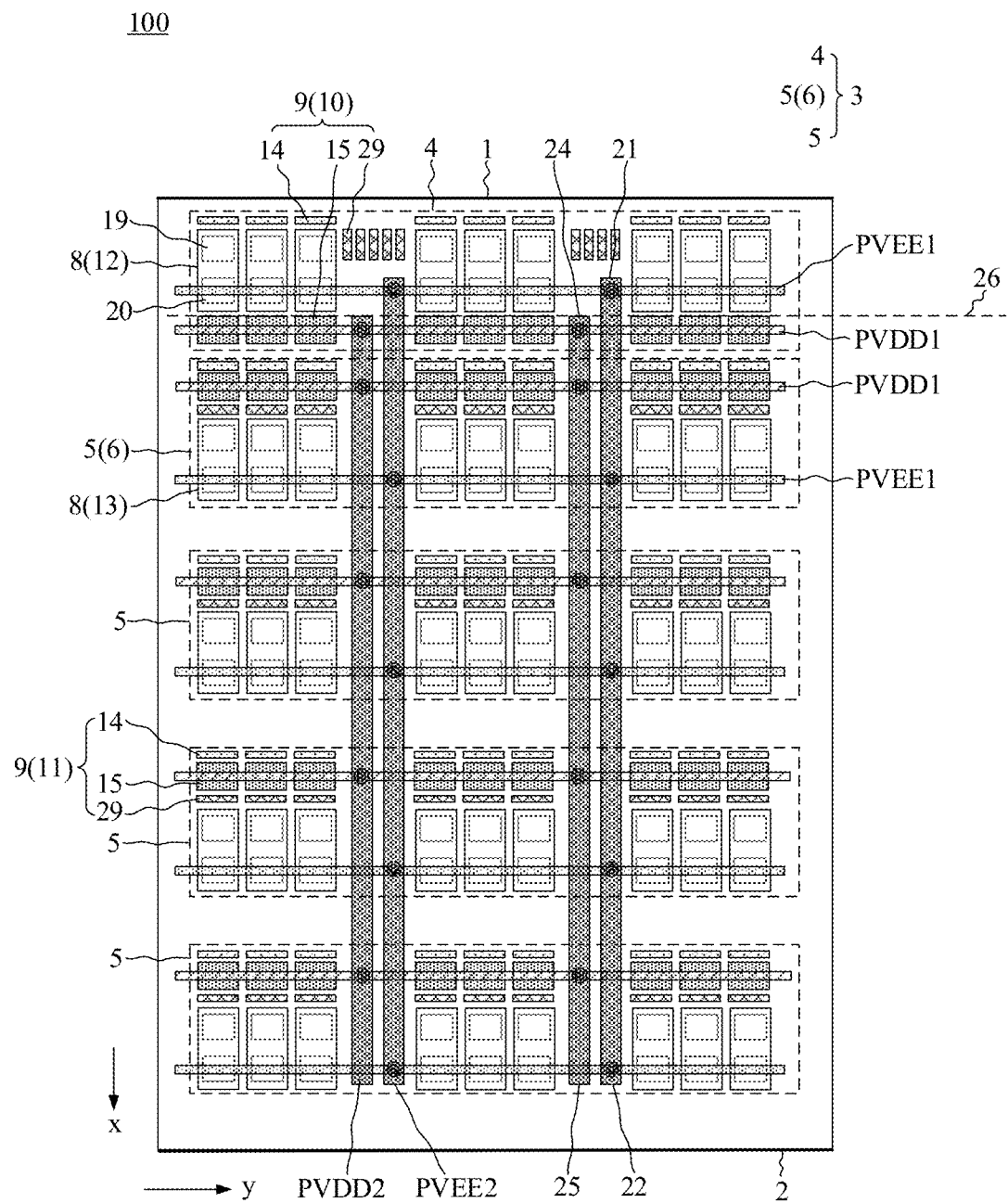
FIG. 11 is another top view of a display panel provided by some embodiments of the present disclosure.

FIG. 11 is another top view of the display panel 100 provided by some embodiments of the present disclosure. In some embodiments, as shown in FIG. 11, the pixel row 3 includes multiple light-emitting device groups 17 arranged along the second direction y, the light-emitting device group 17 includes at least two light-emitting devices 8 arranged along the second direction y, and a distance between two adjacent light-emitting device groups 17 is greater than a distance between two adjacent light-emitting devices 8 in the light-emitting device group 17.

The second positive power signal line PVDD2 extends between adjacent light-emitting device groups 17.

The pixel circuit 9 can also include a third part 29. In the type-A pixel row 4, the third part 29 of at least one type-A pixel circuit 10 is located between two adjacent light-emitting device groups 17 and is also located between the first panel edge 1 and an extension line 26 of the third line edge 24 extending in the second direction y. In at least one type-B pixel row 5, the third part 29 of the type-B pixel circuit 11 is located at a side of the type-B light-emitting device 13 close to the first panel edge 1.

In the above-mentioned configurations, pixel circuit 9 further includes a third part 29, which can reduce the number of devices of the first part 14 without occupying an outer space of the type-A light-emitting device 12, thereby further reducing a size of the first part 14 in the first direction x, and thus providing a larger cutting width of the upper bezel.

Figure 12:
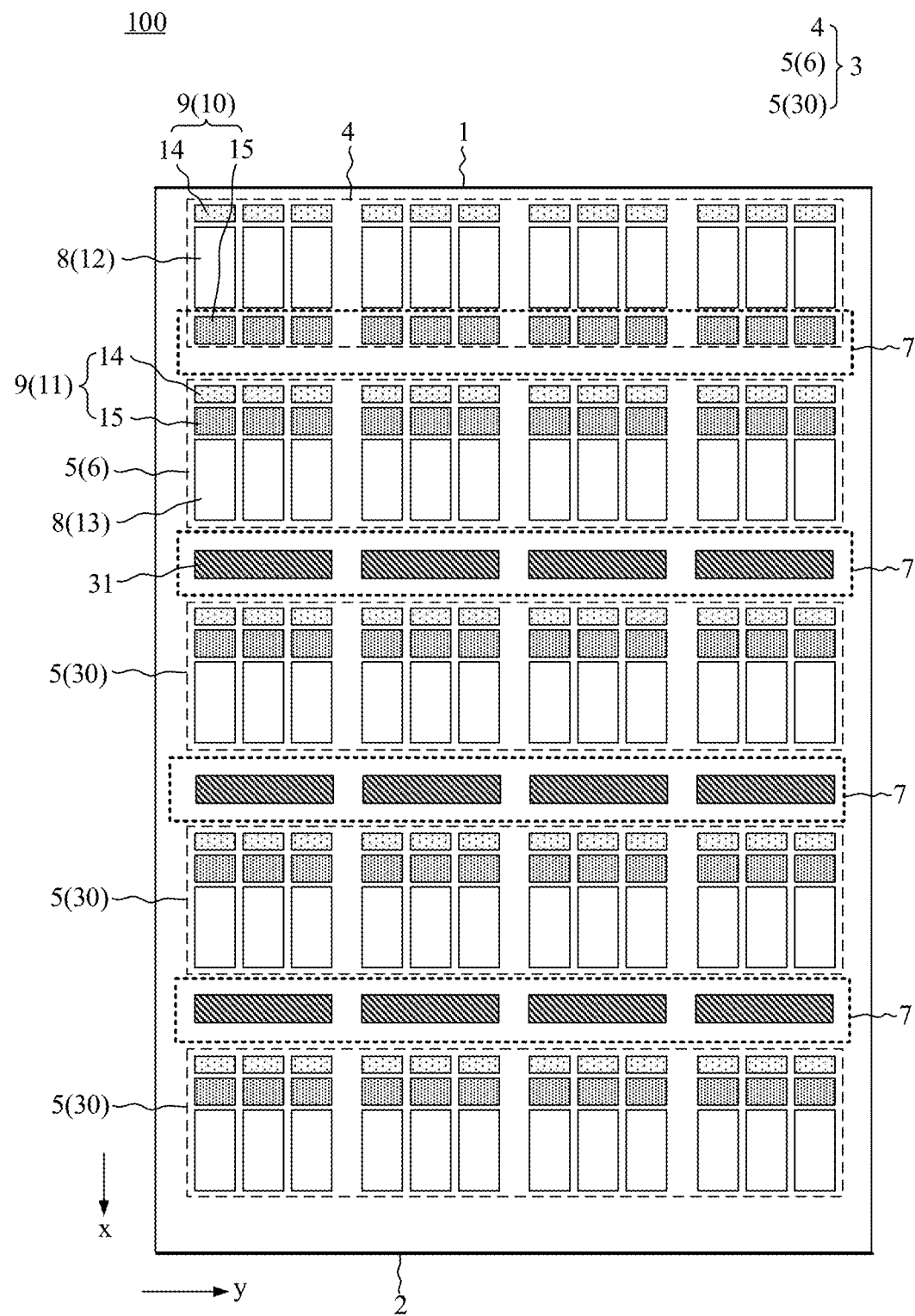
FIG. 12 is another top view of a display panel provided by some embodiments of the present disclosure.

FIG. 12 is another top view of the display panel 100 provided by some embodiments of the present disclosure. In some embodiments, as shown in FIG. 12, the type-B pixel row 5 includes multiple second type-B pixel rows 30 disposed between the first type-B pixel row 6 and the second panel edge 2.

The display panel 100 can also include multiple shift register circuits 31 that are cascaded, and the shift register circuits 31 are located in the spacing area 7 corresponding to each of at least one second type-B pixel row 30.

Figure 20:
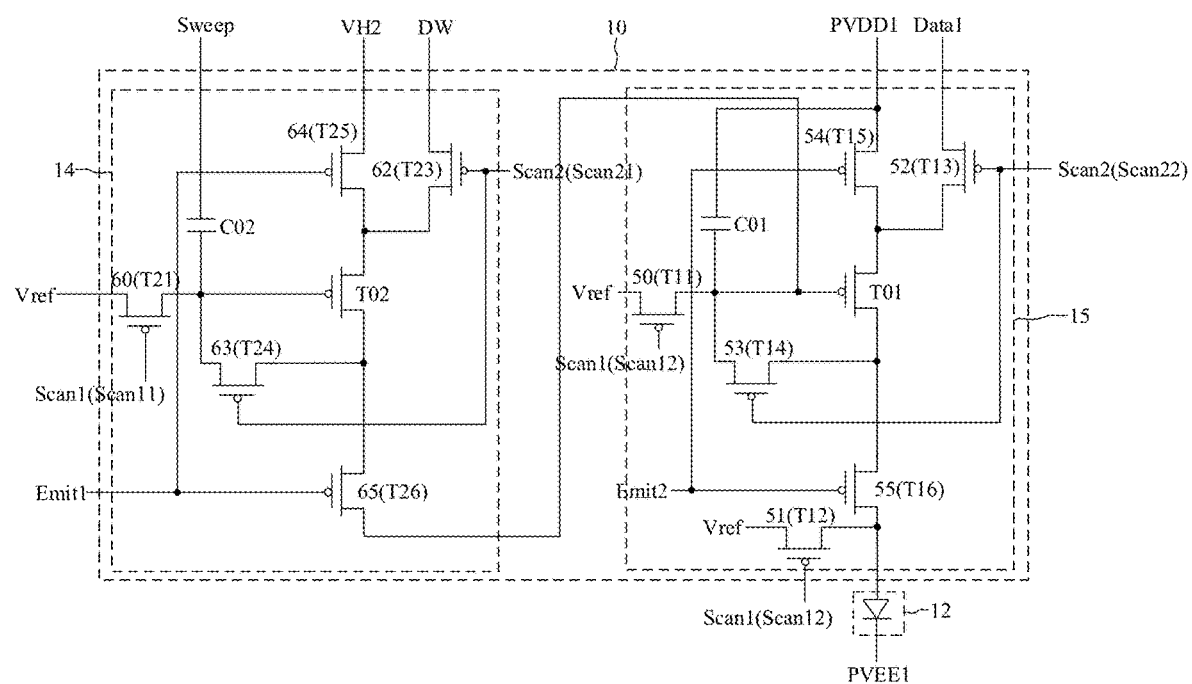
FIG. 20 is a circuit schematic diagram of a type-A pixel circuit provided by some embodiments of the present disclosure.
Figure 23:
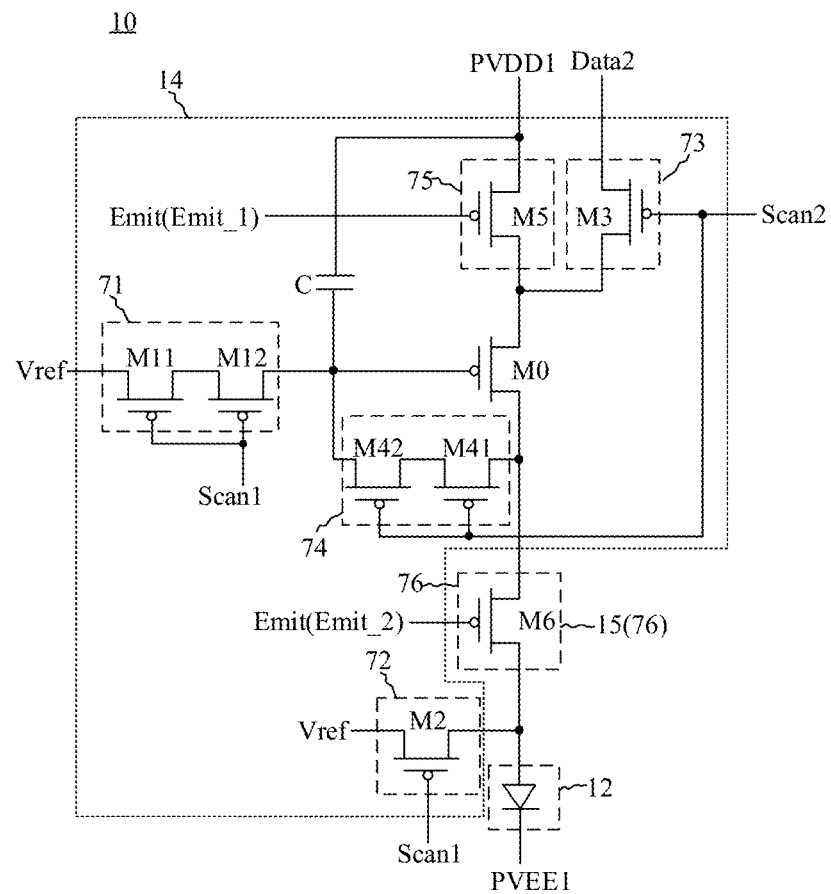
FIG. 23 is another circuit schematic diagram of a type-A pixel circuit provided by some embodiments of the present disclosure.

In combination with FIG. 20 and FIG. 23, the shift register circuits 31 may at least include a shift register circuit 31 electrically connected to a first scanning signal line Scan1, a shift register circuit 31 electrically connected to a second scanning signal line Scan2, and shift register circuits 31 electrically connected to multiple light-emitting control signal lines Emit. At least one of the shift register circuits 31 is located in the spacing area 7 corresponding to at least one second type-B pixel row 30. Each of the shift register circuits 31 that are cascaded is configured to sequentially output an enable level, and the signal line electrically connected to it transmits the enable level to the pixel circuit 9 to control the pixel circuit 9 to perform operations such as resetting, charging, and light-emitting controlling.

According to the embodiments of the present disclosure, by arranging the shift register circuit 31 in the spacing area 7, reasonable usage of the spacing area 7 can be achieved. In this way, the shift register circuit 31 does not need to occupy the space on the left bezel and the right bezel, thereby being beneficial to achieving a bezel design of the display panel 100 having an ultra-narrow left bezel and an ultra-narrow right bezel or achieving a bezel design of the display panel 100 having no left bezel and no right bezel. Meanwhile, when the display panel 100 is applied in the spliced display device, for two display panels 100 adjacent to each other in the second direction, the spacing between adjacent light-emitting devices 8 in these two display panels 100 can be reduced, thereby weakening the visual splicing gap extending in the first direction x in the spliced display device.

The shift register circuit 31 is located only in the spacing area 7 corresponding to the second type-B pixel row 30 and does not occupy the spacing area 7 corresponding to the first type-B pixel row 6. In this way, more space for arranging the second part 15 of the type-A pixel circuit 10 can be provided in the spacing area 7 corresponding to the first type-B pixel row 6, so that the second part 15 of the type-A pixel circuit 10 is properly arranged in the spacing area 7 corresponding to the first type-B pixel row 6.

Figure 13:
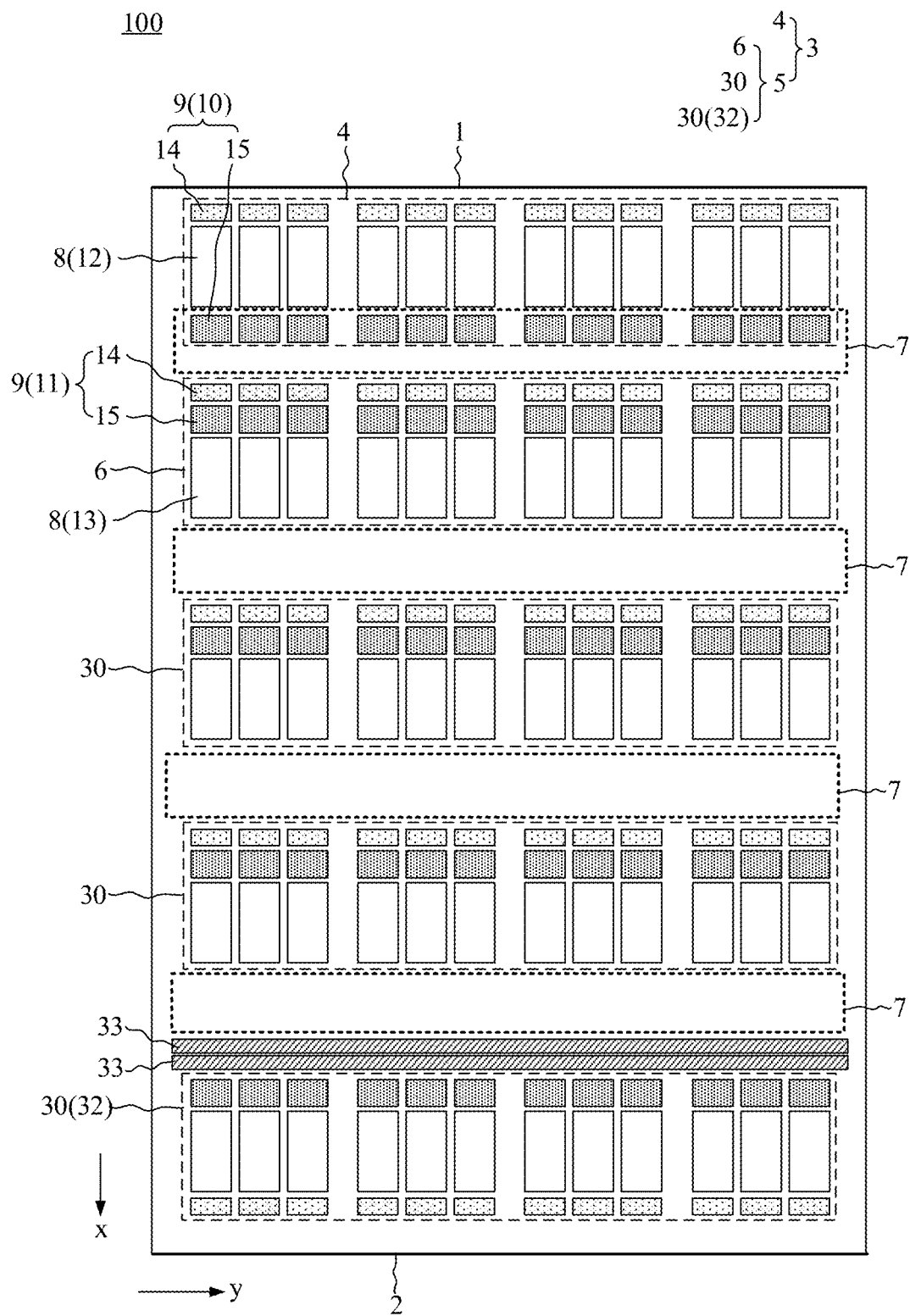
FIG. 13 is another top view of a display panel provided by some embodiments of the present disclosure.
Figure 14:
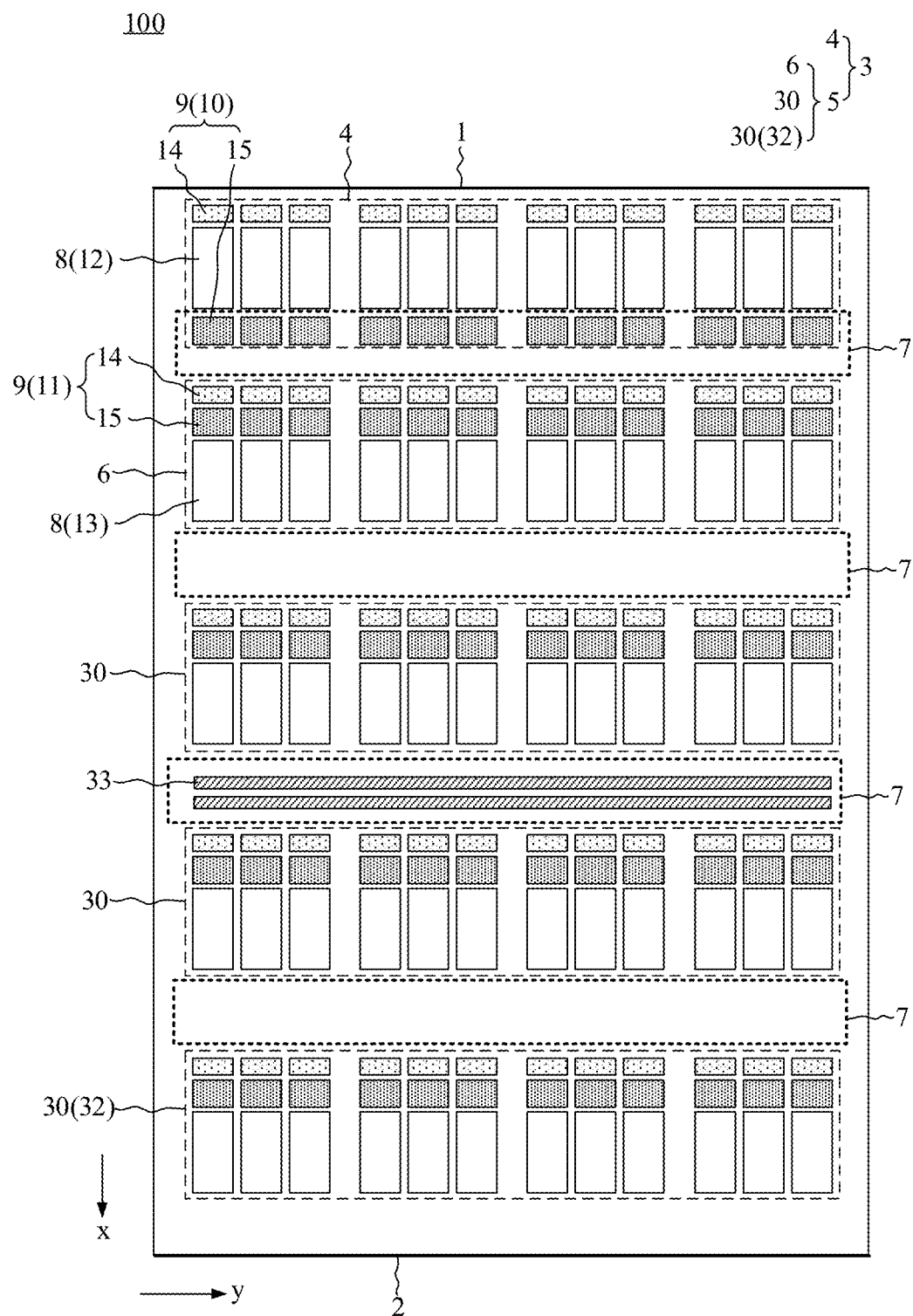
FIG. 14 is another top view of a display panel provided by some embodiments of the present disclosure.

In some embodiments, referring to FIG. 13 and FIG. 14, the type-B pixel rows 5 can also include multiple second type-B pixel rows 30 located between the first type-B pixel row 6 and the second panel edge 2, and the second type-B pixel rows 30 include a second A pixel row 32 adjacent to the second panel edge 2.

The display panel 100 can include a signal bus 33 extending along the second direction y. For example, multiple signal buses 33 can be provided and can be electrically connected to at least one of the second positive power signal line PVDD2, the second negative power signal line PVEE2, the first fixed-potential signal line VGH, and the second fixed-potential signal line VGL. The signal bus 33 is located at a side of the type-B light-emitting device 13 of the second A pixel row 32 away from the second panel edge 2.

In a conventional configuration, the signal bus 33 is generally arranged at the lower bezel of the display panel 100, and thus needs to occupy the space on the lower bezel. In the embodiments of the present disclosure, the signal bus 33 being arranged at the side of the type-B light-emitting device 13 in the second A pixel row 32 away from the second panel edge 2 is equivalent to moving the signal bus 33 to the display area, so that the space on the lower bezel that would be reserved for arranging the signal bus 33 can be cut off, thereby narrowing the upper bezel and the lower bezel at the same time. When the display panel 100 is applied in the spliced display device, a difference between m1 and m2 can be reduced so that the two tends to be substantially the same.

FIG. 13 is another top view of the display panel 100 provided by some embodiments of the present disclosure. In some embodiments, as shown in FIG. 13, in the second A pixel row 32, the second part 15 of the type-B pixel circuit 11 is located at a side of the type-B light-emitting device 13 close to the first panel edge 1, and the first part 14 of the type-B pixel circuit 11 is located at a side of the type-B light-emitting device 13 close to the second panel edge 2.

The signal bus 33 is located between the second part 15 of the second A pixel row 32 and the spacing area 7 corresponding to the second A pixel row 32, and a size of the first part 14 of the type-B pixel circuit 11 in the first direction x is smaller than a total width of the signal bus 33 in the first direction x.

Such a configuration is equivalent to switching a position of the first part 14 of the second A pixel row 32 with a position of the signal bus 33. Since the size of the first part 14 of the type-B pixel circuit 11 in the first direction x is smaller than the total width of the signal bus 33 in the first direction x, the first part 14 of the type-B pixel circuit 11 will occupy a smaller width of the lower bezel after switching the two positions, thus the cutting width of the lower bezel can be reduced. In such a configuration, the signal bus 33 does not need to occupy the spacing area 7, and when the shift register circuit 31 is arranged in the spacing area 7, more space can be provided for arranging the shift register circuit 31.

The signal bus 33 in this configuration is close to the lower bezel of the display panel 100 and thus is closer to the pin at the lower bezel, which makes the signal bus 33 easily be electrically connected to the pin, and also makes a voltage drop of the signal during transmission be smaller.

FIG. 14 is another top view of the display panel 100 provided in some embodiments of the present disclosure. In some embodiments, as shown FIG. 14, the type-B pixel rows 5 also include multiple second type-B pixel rows 30 disposed between the first type-B pixel row 6 and the second panel edge 2. The signal bus 33 is located in the spacing area 7 corresponding to at least one second type-B pixel row 30, that is, the signal bus 33 is moved from the lower bezel to the spacing area 7 of the display area, so that the space that would be reserved for arranging the signal bus 33 on the lower bezel can be cut off to narrow the lower bezel.

In some embodiments, the display area of the display panel 100 includes a first display area, a second display area, and a third display area that are arranged along the first direction x. The signal bus 33 can be located in the second display area located at the middle of the display panel, thereby reducing the delay of the signal provided by the signal bus 33 when the signal is transmitted to the first display area and the third display area.

Figure 15:
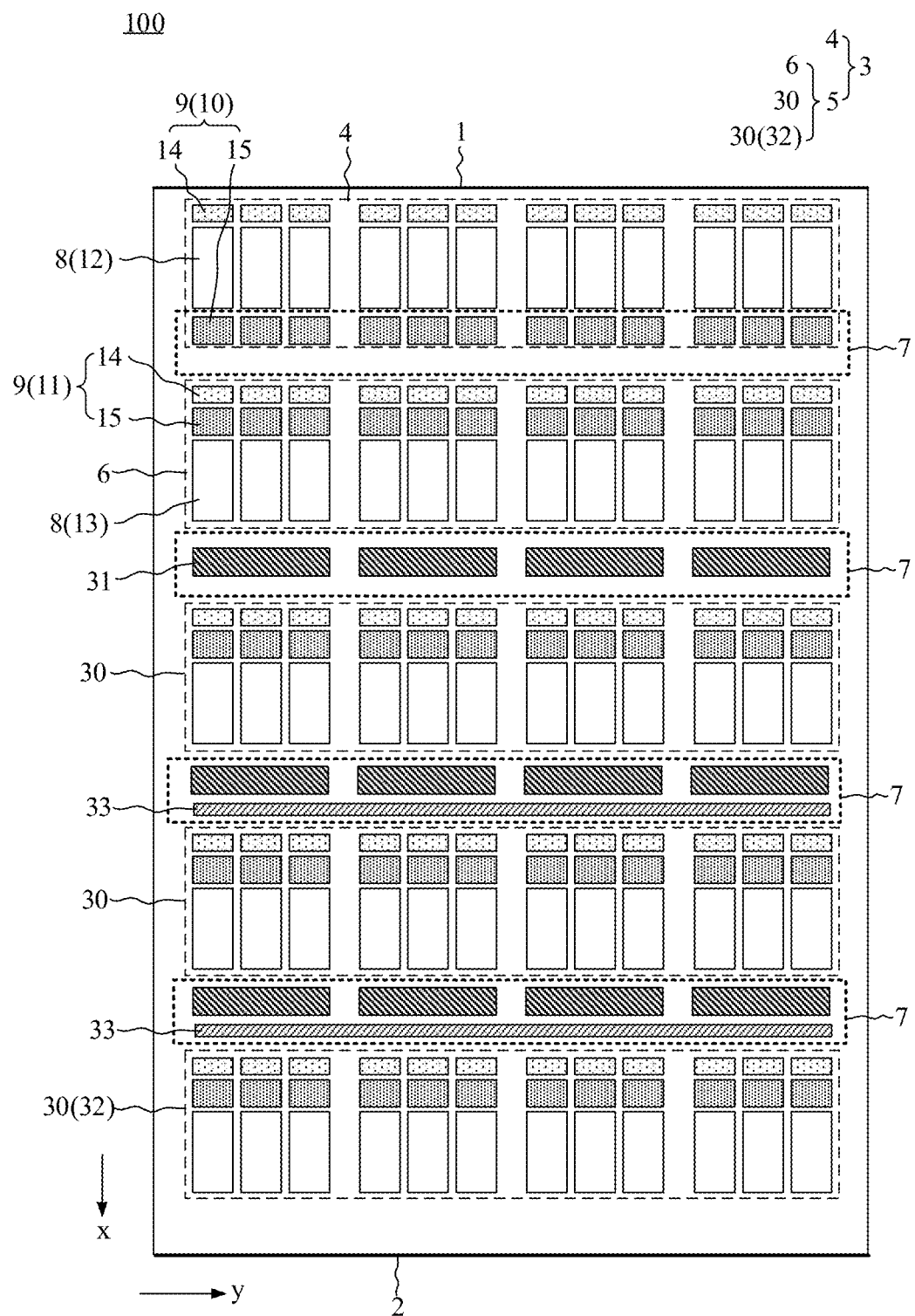
FIG. 15 is another top view of a display panel provided by some embodiments of the present disclosure.

FIG. 15 is another top view of the display panel 100 provided by some embodiments of the present disclosure. In some embodiments, as shown in FIG. 15, the display panel 100 can include multiple shift register circuits 31 that are cascaded, and the shift register circuits 31 are located in the spacing area 7 corresponding to each of at least one second type-B pixel row 30. At most one signal bus 33 is provided in the spacing area 7 in which the shift register circuit 31 is located.

For the spacing area 7 in which the shift register circuit 31 is located, no signal bus 33 or only one signal bus 33 is provided in the spacing area. In this way, even if the signal bus 33 and the shift register circuit 31 are located in a same spacing area 7, a total width occupied by the signal bus 33 and the shift register circuit 31 in the spacing area 7 is not too large, and thus when designing the spacing area 7, it is not necessary to set the spacing area 7 to be too wide in the first direction x, thereby being beneficial to increasing an arrangement density of the light-emitting devices 8 in the display panel 100 to achieve a high-resolution display.

Figure 16:
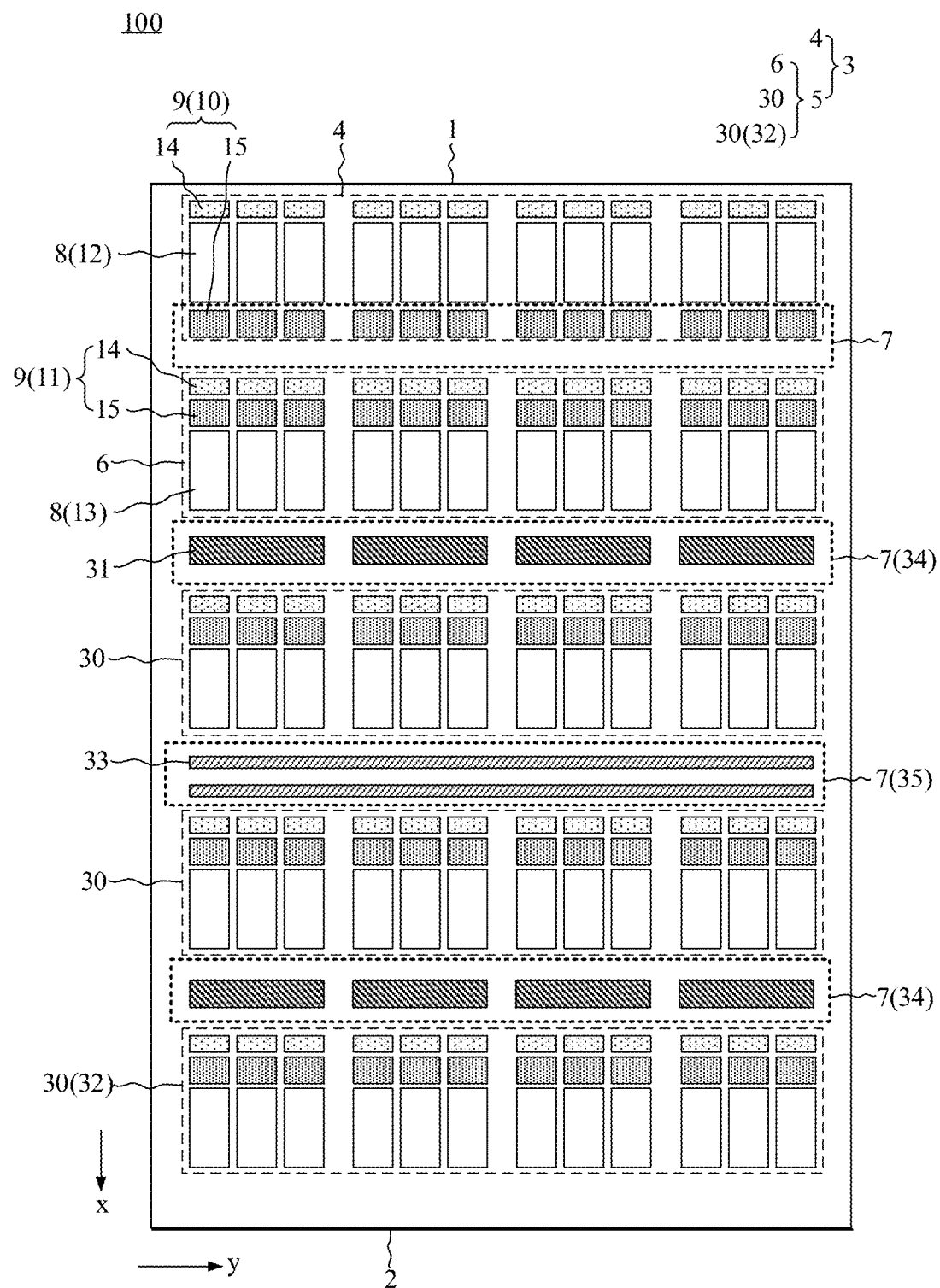
FIG. 16 is another top view of a display panel provided by some embodiments of the present disclosure.

FIG. 16 is another top view of the display panel 100 provided by some embodiments of the present disclosure. In some embodiments, as shown in FIG. 16, the display panel 100 also includes multiple shift register circuits 31 that are cascaded. The spacing areas 7 include a first spacing area 34 and a second spacing area 35, the shift register circuit 31 is located in the first spacing area 34, and the signal bus 33 is located in the second spacing area 35.

Based on the above-mentioned configuration, at most one of the shift register circuit 31 or the signal bus 33 is provided in the spacing area 7, the wiring in the spacing area 7 is simpler, and such a configuration have a smaller requirement for the spacing area 7 in the first direction x. so that the spacing area 7 can be narrower to increase the arrangement density of the light-emitting devices 8 in the display panel 100.

Figure 17:
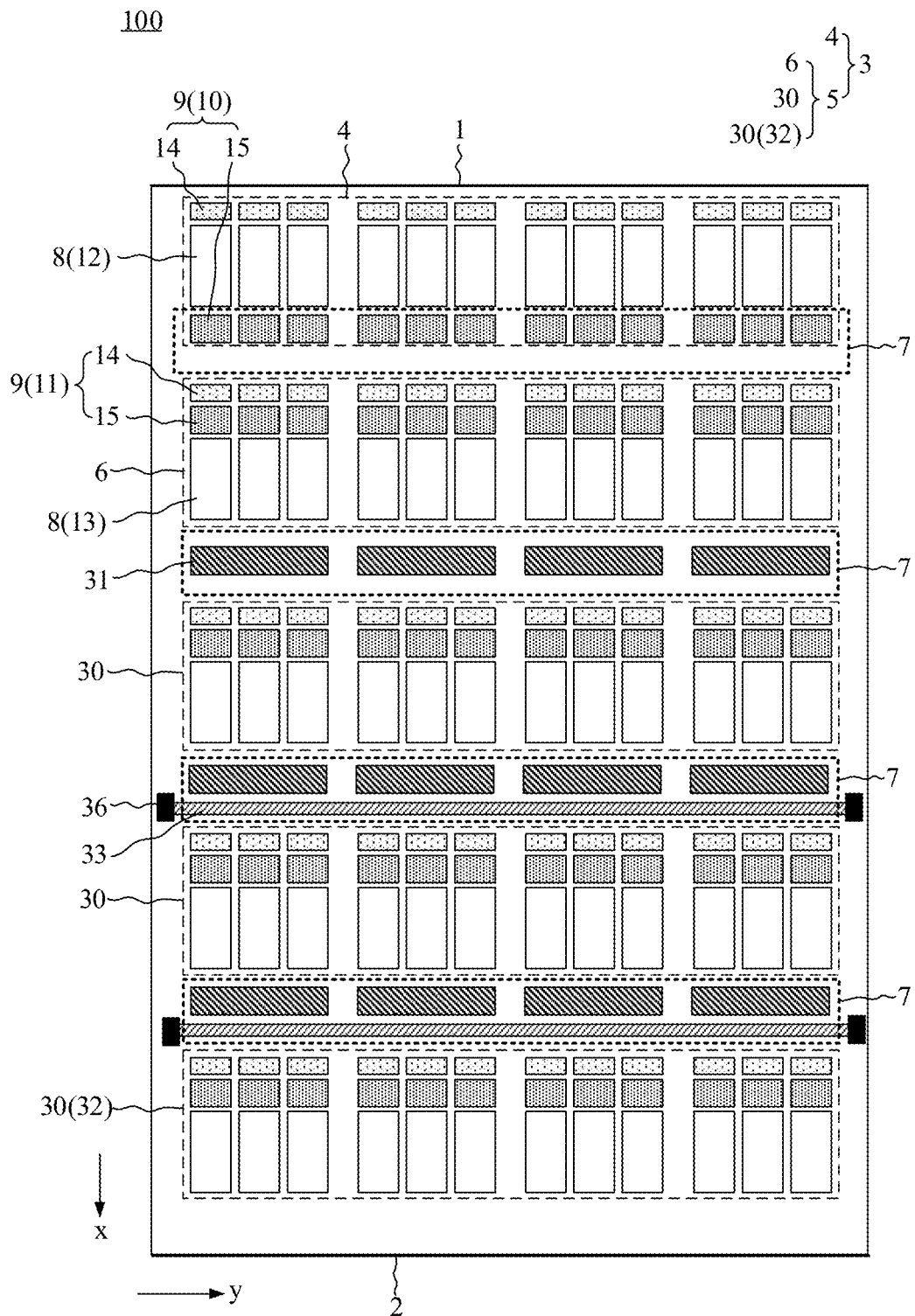
FIG. 17 is another top view of a display panel provided by some embodiments of the present disclosure.
Figure 18:
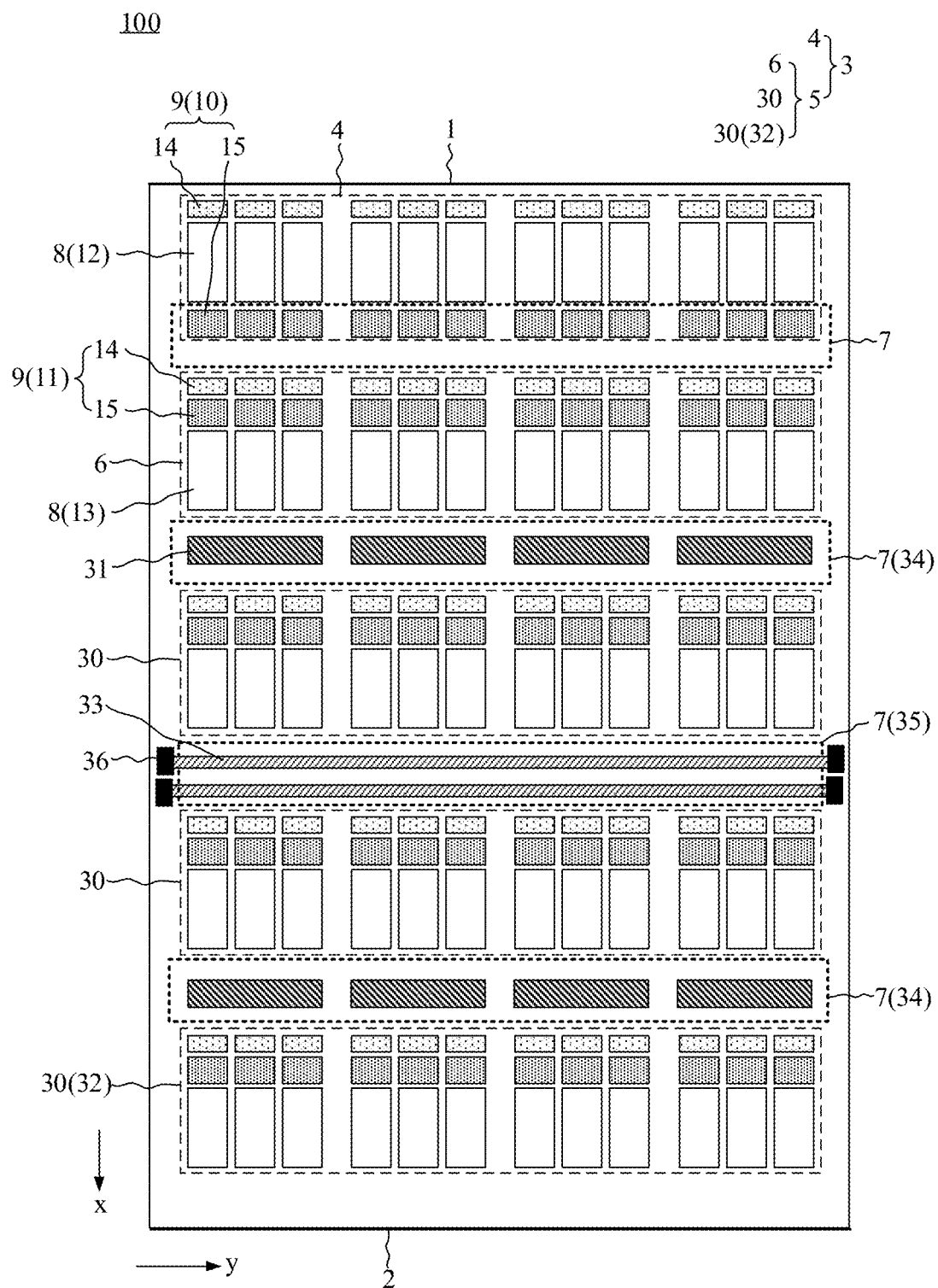
FIG. 18 is another top view of a display panel provided by some embodiments of the present disclosure.

FIG. 17 is another top view of the display panel 100 provided by some embodiments of the present disclosure, and FIG. 18 is another top view of the display panel 100 provided by some embodiments of the present disclosure. In some embodiments, as shown in FIG. 17 and FIG. 18, the display panel 100 can include a first pin 36 electrically connected to the signal bus 33, and the first pin 36 is located on at least one side of the signal bus 33 in the second direction y. For example, the first pin 36 is located at each of two sides of the signal bus 33 in the second direction y. Each of two ends of the signal bus 33 is electrically connected to a respective one first pin 36 to achieve bidirectional transmission of a signal.

When the signal bus 33 is located at a side of the type-B light-emitting device 13 of the second A pixel row 32 away from the second panel edge 2, especially located in the spacing area 7, if the first pin 36 is arranged at the lower bezel, a longer connection line is needed to make the signal bus 33 be electrically connected to the first pin 36, as a result, the wiring in the display area is complicated, and a large voltage drop is generated when the signal is transmitted from the first pin 36 to the signal bus 33. According to the embodiments of the present disclosure, by arranging the first pin 36 on at least one side of the signal bus 33 in the second direction y, the signal bus 33 can be directly connected laterally to the first pin 36, in this case, a connection manner thereof can be simpler, and a smaller voltage drop is generated during the transmission of a signal.

When the first pin 36 is located on at least one side of the signal bus 33 in the second direction y, the first pin 36 can be electrically connected to a driver chip bound to a backlight side of the display panel 100 through a connection lead bent to the backlight side of the display panel 100, to receive a signal provided to the first pin 36 by the driver chip.

Figure 19:
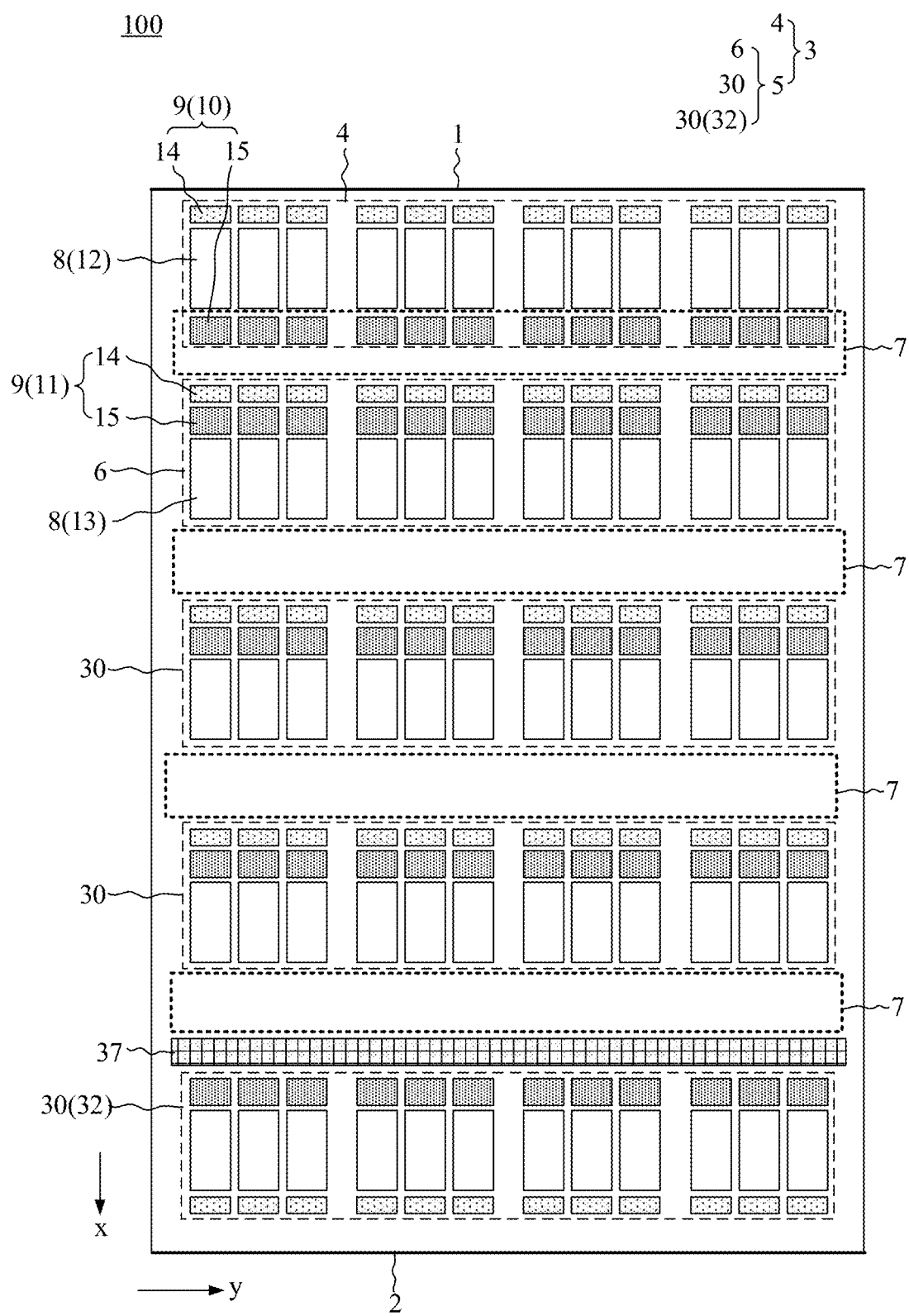
FIG. 19 is another top view of a display panel provided by some embodiments of the present disclosure.

FIG. 19 is another top view of the display panel 100 provided in some embodiments of the present disclosure. In some embodiments, as shown in FIG. 19, the type-B pixel rows 5 include multiple second type-B pixel rows 30 disposed between the first type-B pixel row 6 and the second panel edge 2, and the second type-B pixel rows 30 include a second A pixel row 32 adjacent to the second panel edge 2.

The display panel 100 can include a data gate circuit 37 located at a side of the type-B light-emitting devices 13 of the second A pixel row 32 away from the second panel edge 2.

In some embodiments, the data gate circuit 37 includes multiple gate switches, input terminals of the multiple gate switches in the data gate circuit 37 are electrically connected to a same source signal line, and control terminals of the multiple gate switches in the data gate circuit 37 are electrically connected to multiple clock signal lines in a one-to-one correspondence. When the pixel circuit 9 adopts the circuit structure shown in FIG. 20, the multiple gate switches in the data gate circuit 37 are electrically connected to multiple variable-voltage data lines DW in one-to-one correspondence, and when the pixel circuit 9 adopts the circuit structure shown in FIG. 23, the multiple gate switches in the data gate circuit 37 are electrically connected to multiple data writing lines Data2 in one-to-one correspondence. By controlling the gate switches in the data gate circuit 37 to be turned on in a time division manner, the data voltage provided by the source signal line can be written to different variable-voltage data lines DW or different data writing lines Data2 in a time division manner. The data gate circuit 37 is provided to reduce the number of the pins in the lower bezel, thereby reducing the space for the pins on the lower bezel.

In a conventional configuration, the data gate circuit 37 is usually arranged at the lower bezel of the display panel 100, and thus occupies space on the lower bezel. In the embodiments of the present disclosure, the data gate circuit 37 being arranged at a side of the type-B light-emitting device 13 of the second A pixel row 32 away from the second panel edge 2 is equivalent to moving the data gate circuit 37 to the display area, and thus the space on the lower bezel that would otherwise be reserved for arranging the data gate circuit 37 can be cut off, thereby narrowing the upper bezel and the lower bezel at the same time. When the display panel 100 is applied in the spliced display device, a difference between m1 and m2 can be further reduced, so that the two tend to be substantially the same.

In some embodiments, referring to FIG. 19 again, in the second A pixel row 32, the second part 15 of the type-B pixel circuit 11 is located at a side of the type-B light-emitting device 13 close to the first panel edge 1, and the first part 14 of the type-B pixel circuit 11 is located at a side of the type-B light-emitting device 13 close to the second panel edge 2.

The data gate circuit 37 is located between the second part 15 of the second A pixel row 32 and the spacing area 7 corresponding to the second A pixel row 32, and a size of the first part 14 of the type-B pixel circuit 11 in the first direction x is smaller than a size of the data gate circuit 37 in the first direction x.

Such a configuration is equivalent to switching a position of the first part 14 of the second A pixel row 32 with a position of the data gate circuit 37, and since the size of the first part 14 of the type-B pixel circuit 11 in the first direction x is smaller than the size of the data gate circuit 37 in the first direction x, the width of the lower bezel occupied by the first part 14 of the type-B pixel circuit 11 will be smaller after switching the two positions. In this way, the cutting width of the lower bezel can be reduced. In this configuration, the data gate circuit 37 does not need to occupy the spacing area 7, and when the shift register circuit 31 is arranged in the spacing area 7, more space for arranging the shift register circuit 31 can be provided.

The data gate circuit 37 in this configuration is close to the lower bezel of the display panel 100, and thus is closer to the pin at the lower bezel, thereby making the data gate circuit 37 be electrically connected to the pin, and also making a voltage drop of the signal during transmission be smaller.

In other embodiments of the present disclosure, the data gate circuit 37 can also be located in the spacing area 7 corresponding to each of at least one second type-B pixel row 30, and the pin connected to the data gate circuit 37 can be located at each of at least one side of the data gate circuit 37 in the second direction y.

Figure 21:
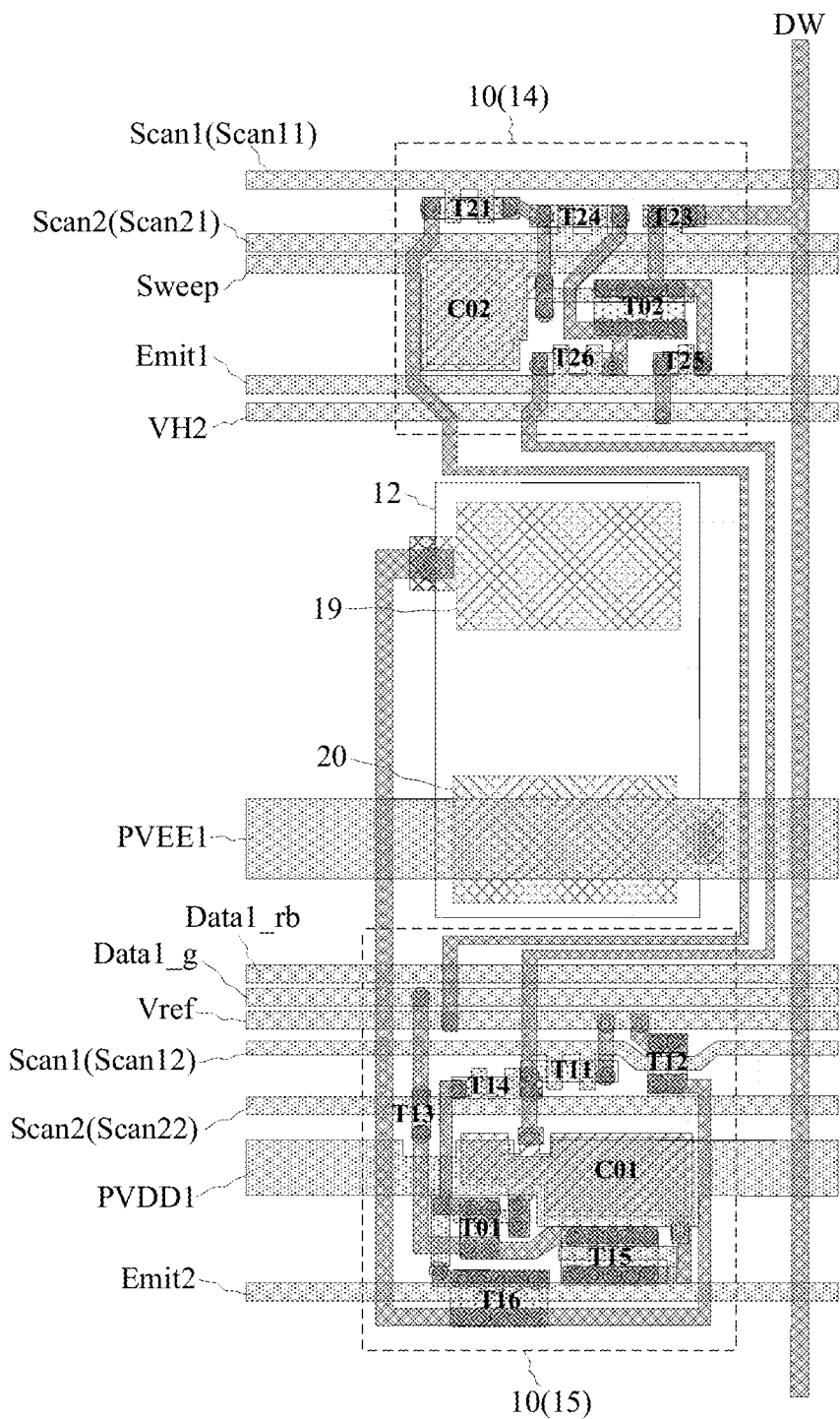
FIG. 21 is a layer schematic diagram of a type-A pixel circuit and a type-A light-emitting device provided by some embodiments of the present disclosure.

FIG. 20 is a circuit schematic diagram of the type-A pixel circuit 10 provided by some embodiments of the present disclosure, and FIG. 21 is a layer schematic diagram of the type-A pixel circuit 10 and the type-A light-emitting device 12 provided in some embodiments of the present disclosure. In some embodiments, as shown in FIG. 20 and FIG. 21, the second part 15 of the type-A pixel circuit 10 includes a display driver transistor T01, a display gate reset module 50, a display anode reset module 51, a display data writing module 52, a display threshold compensation module 53, a first display light-emitting control module 54, a second display light-emitting control module 55, and a display storage capacitor C01.

The display gate reset module 50 is electrically connected to the first scanning signal line Scan1, a reset signal line Vref, and a gate of the display driver transistor T01. The display gate reset module 50 can include a display gate reset transistor T11, a gate of the display gate reset transistor T11 is electrically connected to the first scanning signal line Scan1, a first electrode of the display gate reset transistor T11 is electrically connected to the reset signal line Vref, and a second electrode of the display gate reset transistor T11 is electrically connected to the gate of the display driver transistor T01.

The display anode reset module 51 is electrically connected to the first scanning signal line Scan1, the reset signal line Vref, and the type-A light-emitting device 12. The display anode reset module 51 can include a display anode reset transistor T12, a gate of the display anode reset transistor T12 is electrically connected to the first scanning signal line Scan1, a first electrode of the display anode reset transistor T12 is electrically connected to the reset signal line Vref, and a second electrode of the display anode reset transistor T12 is electrically connected to an anode of the first type of light-emitting device 12.

The display data writing module 52 is electrically connected to the second scanning signal line Scan2, a constant-voltage data line Data1, and a first electrode of the display driver transistor T01. The display data writing module 52 can include a display data writing transistor T13, a gate of the display data writing transistor T13 is electrically connected to the second scanning signal line Scan2, a first electrode of the display data writing transistor T13 is electrically connected to the constant-voltage data line Data1, and a second electrode of the display data writing transistor T13 is electrically connected to the first electrode of the display driver transistor T01.

The display threshold compensation module 53 is electrically connected to the second scanning signal line Scan2, the second electrode of the display driver transistor T01, and the gate of the display driver transistor T01. The display threshold compensation module 53 can include a display threshold compensation transistor T14, a gate of the display threshold compensation transistor T14 is electrically connected to the second scanning signal line Scan2, a first electrode of the display threshold compensation transistor T14 is electrically connected to a second electrode of the display driver transistor T01, and a second electrode of the display threshold compensation transistor T14 is electrically connected to a gate of the display driver transistor T01.

The first display light-emitting control module 54 is electrically connected to a second light-emitting control signal line Emit2, the first positive power signal line PVDD1, and the first electrode of the display driver transistor T01. The first display light-emitting control module 54 can include a first display light-emitting control transistor T15, a gate of the first display light-emitting control transistor T15 is electrically connected to the second light-emitting control signal line Emit2, a first electrode of the first display light-emitting control transistor T15 is electrically connected to the first positive power signal line PVDD1, and a second electrode of the first display light-emitting control transistor T15 is electrically connected to the first electrode of the display driver transistor T01.

The second display light-emitting control module 55 is electrically connected to the second light-emitting control signal line Emit2, the second electrode of the display driver transistor T01, and the type-A light-emitting device 12. The second display light-emitting control module 55 can include a second display light-emitting control transistor T16, a gate of the second display light-emitting control transistor T16 is electrically connected to the second light-emitting control signal line Emit2, a first electrode of the second display light-emitting control transistor T16 is electrically connected to the second electrode of the display driver transistor T01, and a second electrode of the second display light-emitting control transistor T16 is electrically connected to the type-A light-emitting device 12.

The display storage capacitor C1 is electrically connected to the first positive power signal line PVDD1 and the gate of the display driver transistor T01.

The first part 14 of the type-A pixel circuit 10 can include a voltage-controlled driver transistor T02, a voltage-controlled gate reset module 60, a voltage-controlled data writing module 62, a voltage-controlled threshold compensation module 63, a first voltage-controlled light-emitting control module 64, a second voltage-controlled light-emitting control module 65, and a voltage-controlled storage capacitor C02.

The voltage-controlled gate reset module 60 is electrically connected to the first scanning signal line Scan1, the reset signal line Vref, and the gate of the voltage-controlled driver transistor T02. The voltage-controlled gate reset module 60 can include a voltage-controlled gate reset transistor T21, a gate of the voltage-controlled gate reset transistor T21 is electrically connected to the first scanning signal line Scan1, a first electrode of the voltage-controlled gate reset transistor T21 is electrically connected to the reset signal line Vref, and a second electrode of the voltage-controlled gate reset transistor T21 is electrically connected to the gate of the voltage-controlled driver transistor T02.

The voltage-controlled data writing module 62 is electrically connected to the second scanning signal line Scan2, the variable-voltage data line DW, and the first electrode of the voltage-controlled driver transistor T02. The voltage-controlled data writing module 62 can include a voltage-controlled data writing transistor T23, a gate of the voltage-controlled data writing transistor T23 is electrically connected to the second scanning signal line Scan2, a first electrode of the voltage-controlled data writing transistor T23 is electrically connected to the variable-voltage data line DW, and a second electrode of the voltage-controlled data writing transistor T23 is electrically connected to the first electrode of the voltage-controlled driver transistor T02.

The voltage-controlled threshold compensation module 63 is electrically connected to the second scanning signal line Scan2, the second electrode of the voltage-controlled driver transistor T02, and the gate of the voltage-controlled driver transistor T02. The voltage-controlled threshold compensation module 63 can include a voltage-controlled threshold compensation transistor T24, a gate of the voltage-controlled threshold compensation transistor T24 is electrically connected to the second scanning signal line Scan2, a first electrode of the voltage-controlled threshold compensation transistor T24 is electrically connected to the second electrode of the voltage-controlled driver transistor T02, and a second electrode of the voltage-controlled threshold compensation transistor T24 is electrically connected to a gate of the voltage-controlled driver transistor T02.

The first voltage-controlled light-emitting control module 64 is electrically connected to the first light-emitting control signal line Emit1, a voltage-controlled power signal line VH2, and the first electrode of the voltage-controlled driver transistor T02. The first voltage-controlled light-emitting control module 64 can include a first voltage-controlled light-emitting control transistor T25, a gate of the first voltage-controlled light-emitting control transistor T25 is electrically connected to the first light-emitting control signal line Emit1, a first electrode of the first voltage-controlled light-emitting control transistor T25 is electrically connected to the first positive power signal line PVDD1, and a second electrode of the first voltage-controlled light-emitting control transistor T25 is electrically connected to the first electrode of the voltage-controlled driver transistor T02.

The second voltage-controlled light-emitting control module 65 is electrically connected to the first light-emitting control signal line Emit1, the second electrode of the voltage-controlled driver transistor T02 and the gate of the display driver transistor T01. The second voltage-controlled light-emitting control module 65 can include a second voltage-controlled light-emitting control transistor T26, a gate of the second voltage-controlled light-emitting control transistor T26 is electrically connected to the first light-emitting control signal line Emit1, a first electrode of the second voltage-controlled light-emitting control transistor T26 is electrically connected to the second electrode of the voltage-controlled driver transistor T02, and a second electrode of the second voltage-controlled light-emitting control transistor T26 is electrically connected to the gate of the display driver transistor T01.

The voltage-controlled storage capacitor C02 is electrically connected to a sweeping signal line Sweep and the gate of the voltage-controlled driver transistor T02.

In some embodiments, the display panel 100 can include two types of constant-voltage data lines Data1, which are indicated by reference signs Data1_gb and Data1_r as shown in FIG. 21. The pixel circuit 9 electrically connected to a green light-emitting device 8 and the pixel circuit 9 electrically connected to a blue light-emitting device 8 are connected to the constant-voltage data line Data1_gb, the pixel circuit 9 electrically connected to a red light-emitting device 8 is connected to the constant-voltage data line Data1_r. The voltages transmitted on these two types of constant-voltage data lines Data1 can be different from each other.

Figure 22:
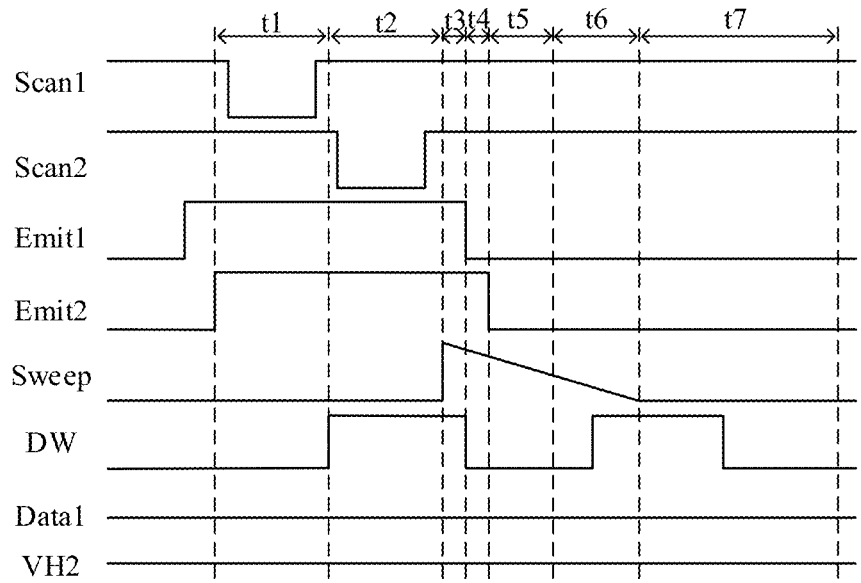
FIG. 22 is a timing sequence corresponding to FIG. 20.

FIG. 22 is a timing sequence corresponding to FIG. 20. As shown in FIG. 22, the operation process of the type-A pixel circuit 10 includes a first period t1 to a seventh period t7.

During the first period t1, the first scanning signal line Scan1 provides a low level, the voltage-controlled gate reset transistor T21 is turned on to reset the gate of the voltage-controlled driver transistor T02, and at the same time, the display gate reset transistor T11 and the display anode reset transistor T12 are turned-on to reset the gate of the display driver transistor T01 and the anode of the type-A light-emitting device 12.

During the second period t2, the second scanning signal line Scan2 provides a low level, the voltage-controlled data writing transistor T23 and the voltage-controlled threshold compensation transistor T24 are turned on to write a data voltage to the gate of the voltage-controlled driver transistor T02 to compensate a threshold of the voltage-controlled driver transistor T02, and at the same time, the display data writing transistor T13 and the display threshold compensation transistor T14 are turned on to write a data voltage to the gate of the display driver transistor T01 to compensate a threshold of the display driver transistor T01.

During the third period t3, the frequency sweeping signal line Sweep transmits a triangular wave signal, and a gate potential of the voltage-controlled driver transistor T02 is pulled up to cause the voltage-controlled driver transistor T02 to be cut off.

During the fourth period t4, the first light-emitting control signal line Emit1 provides a low level, causing the first voltage-controlled light-emitting control transistor T25 and the second voltage-controlled light-emitting control transistor T26 to be turned on.

During the fifth period t5, the second light-emitting control signal line Emit2 provides a low level, causing the first display light-emitting control transistor T15 and the second display light-emitting control transistor T16 to be turned on.

Since the display driver transistor T01 is turned on during this period, the type-A light-emitting device 12 can be controlled to emit light.

During the sixth period t6, the triangular wave signal transmitted on the frequency sweeping signal line Sweep is reduced to a critical voltage, and the voltage-controlled driver transistor T02 is turned on.

During the seventh period t7, the voltage-controlled driver transistor T02, the first voltage-controlled light-emitting control transistor T15 and the second voltage-controlled light-emitting control transistor T16 are turned on, a voltage-controlled power signal provided by the voltage-controlled power signal line VH2 is transmitted to the gate of the display driver transistor T01 to control the display driver transistor T01 to be turned off, and the type-A light-emitting device 12 stops emitting light.

In some embodiments, referring to FIG. 20 and FIG. 21 again, the first scanning signal lines Scan1 include a first A scanning signal line Scan11 electrically connected to the first part 14 and a first B scanning signal line Scan12 electrically connected to the second part 15, and the second scanning signal lines Scan2 include a second A scanning signal line Scan21 electrically connected to the first part 14 and a second B scanning signal line Scan22 electrically connected to the second part 15.

The first A scanning signal line Scan11 and the second A scanning signal line Scan21 each overlap with the first part 14 in the direction perpendicular to the plane of the display panel 100, and the first B scanning signal line Scan12 and the second B scanning signal line Scan22 each overlap with the second part 15 in the direction perpendicular to the plane of the display panel 100.

Since the first part 14 and the second part 15 each are electrically connected to the first scanning signal line Scan1 and the second scanning signal line Scan2, the first scanning signal line Scan1 and the second scanning signal line Scan2 that adopt the above-mentioned configurations can facilitate the connection of the first part 14 and the second part 15 to the first scanning signal line Scan1 and the second scanning signal line Scan2, thereby effectively reducing a voltage drop when the first scanning signal and the second scanning signal are transmitted to the first part 14 and the second part 15.

Figure 24:
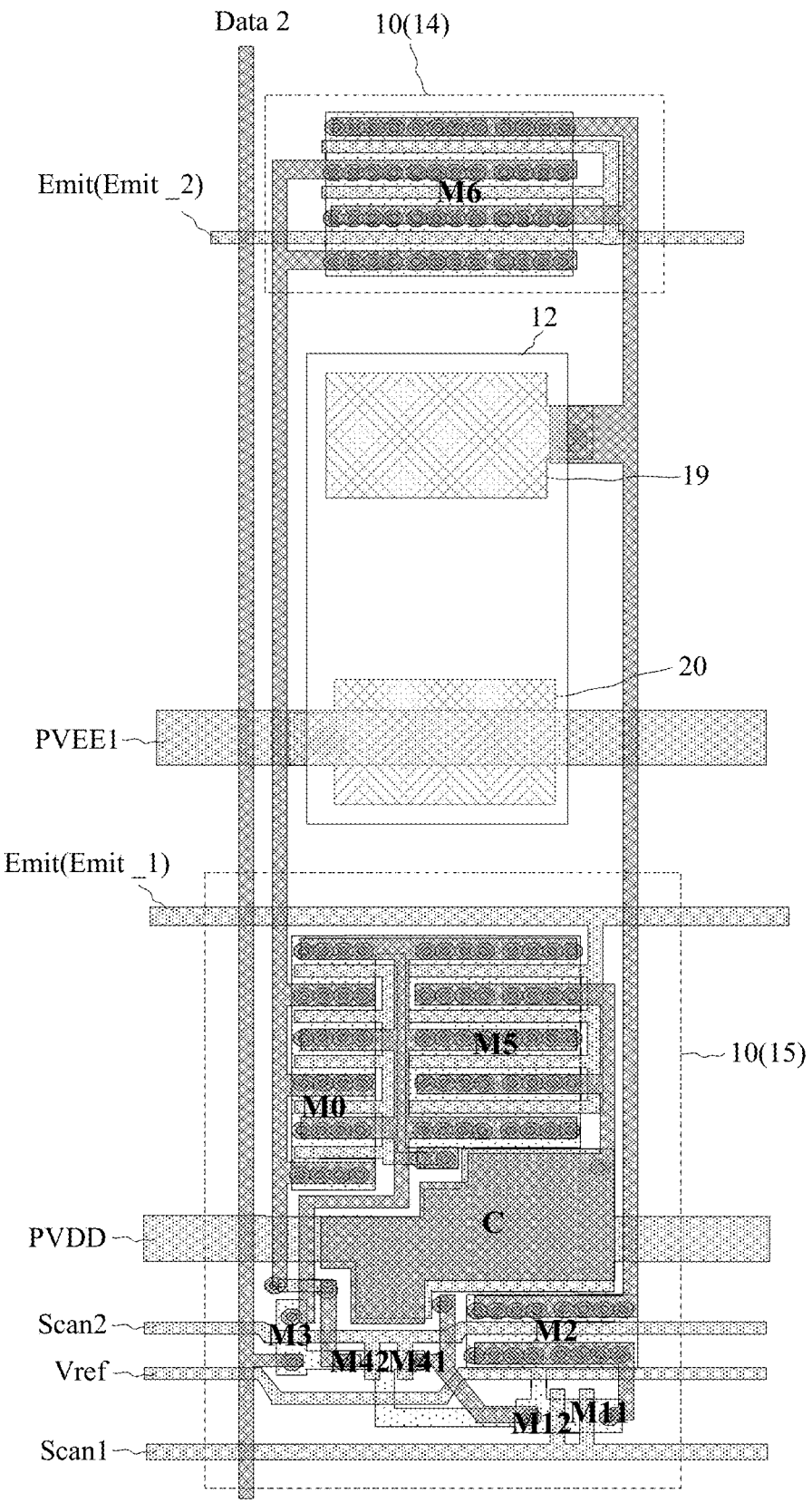
FIG. 24 is another layer schematic diagram of a type-A pixel circuit and a type-A light-emitting device provided by some embodiments of the present disclosure.

FIG. 23 is another circuit schematic diagram of the type-A pixel circuit 10 provided in some embodiments of the present disclosure, and FIG. 24 is another layer schematic diagram of the type-A pixel circuit 10 and the first type of light-emitting device 12 provided by some embodiments of the present disclosure. In some embodiments, as shown in FIG. 23 and FIG. 24, the second part 15 of the type-A pixel circuit 10 includes a driver transistor M0, a gate reset module 71, an anode reset module 72, a data writing module 73, a threshold compensation module 74, a first light-emitting control module 75, and a storage capacitor C.

The gate reset module 71 is electrically connected to the first scanning signal line Scan1, the reset signal line Vref, and the gate of the driver transistor M0. The gate reset module 71 can include a first gate reset transistor M11 and a second gate reset transistor M12, a gate of the first gate reset transistor M11 and a gate of the second gate reset transistor M12 are each electrically connected to the first scanning signal line Scan1, a first electrode of the first gate reset transistor M11 is electrically connected to the reset signal line Vref, a second electrode of the first gate reset transistor M11 is electrically connected to a first electrode of the second gate reset transistor M12, and a second electrode of the second gate reset transistor M12 is electrically connected to a gate of the driver transistor M0. The first gate reset transistor M11 and the second gate reset transistor M12 form a dual-gate structure with a low leakage current, thus reducing the effect of the leakage current on a potential of the gate of the driver transistor M0 and improving the stability of the operation status of the driver transistor M0.

The anode reset module 72 is electrically connected to the first scanning signal line Scan1, the reset signal line Vref and the type-A light-emitting device 12. The anode reset module 72 can include an anode reset transistor M2, a gate of the anode reset transistor M2 is electrically connected to the first scanning signal line Scan1, a first electrode of the anode reset transistor M2 is electrically connected to the reset signal line Vref, and a second electrode of the anode reset transistor M2 is electrically connected to the type-A light-emitting device 12.

The data writing module 73 is electrically connected to the second scanning signal line Scan2, the data writing line Data2, and the first electrode of the driver transistor M0. The data writing module 73 can include a data writing transistor M3, a gate of the data writing transistor M3 is electrically connected to the second scanning signal line Scan2, a first electrode of the data writing transistor M3 is electrically connected to the data writing line Data2, and a second electrode of the data writing transistor M3 is electrically connected to the first electrode of the driver transistor M0.

The threshold compensation module 74 is electrically connected to the second scanning signal line Scan2, the second electrode of the driver transistor M0, and the gate of the driver transistor M0. The threshold compensation module 74 can include a first threshold compensation transistor M41 and a second threshold compensation transistor M42, a gate of the first threshold compensation transistor M41 and a gate of the second threshold compensation transistor M42 are each electrically connected to the second scanning signal line Scan2, a first electrode of the first threshold compensation transistor M41 is electrically connected to the second electrode of the driver transistor M0, a second electrode of the first threshold compensation transistor M41 is electrically connected to a first electrode of the second threshold compensation transistor M42, and a second electrode of the second threshold compensation transistor M42 is electrically connected to the gate of the driver transistor M0. The first threshold compensation transistor M41 and the second threshold compensation transistor M42 form a dual-gate structure with a low leakage current, thus reducing the effect of the leakage current on a potential of the gate of the driver transistor M0 and improving the stability of the operation status of the driver transistor M0.

The first light-emitting control module 75 is electrically connected to the light-emitting control signal line Emit, the first positive power signal line PVDD1, and the first electrode of the driver transistor M0. The first light-emitting control module 75 can include a first light-emitting control transistor M5, a gate of the first light-emitting control transistor M5 is electrically connected to the light-emitting control signal line Emit, a first electrode of the first light-emitting control transistor M5 is electrically connected to the first positive power signal line PVDD1, and a second electrode of the first light-emitting control transistor M5 is electrically connected to the first electrode of the driver transistor M0.

The storage capacitor is electrically connected to the first positive power signal line PVDD1 and the gate of the driver transistor M0.

The first part 14 of the type-A pixel circuit 10 includes a second light-emitting control module 76, which is electrically connected to the light-emitting control signal line Emit, the second electrode of the driver transistor M0, and the type-A light-emitting device 12. The second light-emitting control module 76 can include a second light-emitting control transistor M6. A gate of the second light-emitting control transistor M6 is electrically connected to the light-emitting control signal line Emit, a first electrode of the second light-emitting control transistor M6 is electrically connected to the second electrode of the driver transistor M0, and a second electrode of the second light-emitting control transistor M6 is electrically connected to the type-A light-emitting device 12.

Figure 25:
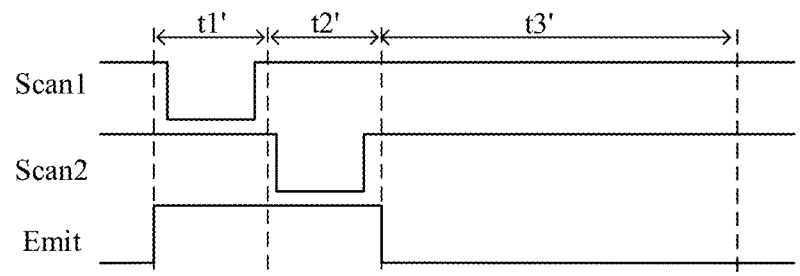
FIG. 25 is a timing sequence corresponding to FIG. 23.

FIG. 25 is a timing sequence corresponding to FIG. 23. As shown in FIG. 25, the operation process of the type-A pixel circuit 10 includes a first period t1' to a third period t3'.

During the first period t1', the first scanning signal line Scan1 provides a low level, and the gate reset transistor M1 and the anode reset transistor M2 are turned on to reset the gate of the driver transistor M0 and the anode 19 of the type-A light-emitting device 12.

During the second period t2', the second scanning signal line Scan2 provides a low level, and the data writing transistor M3 and the threshold compensation transistor M4 are turned on to write a data voltage to the gate of the driver transistor M0 to compensate a threshold of the driver transistor M0.

During the third period t3', the light-emitting control signal line Emit provides a low level, and the first light-emitting control transistor M5 and the second light-emitting control transistor M6 are turned on to control the type-A light-emitting device 12 to emit light under a driving current converted by the driver transistor M0.

In some embodiments, referring to FIG. 23 and FIG. 24 again, the light-emitting control signal lines Emit include a first light-emitting control signal sub-line Emit_1 electrically connected to the first light-emitting control module 75 and a second light-emitting control signal sub-line Emit_2 electrically connected to the second light-emitting control module 76.

In the direction perpendicular to the plane of the display panel 100, the first light-emitting control signal sub-line Emit_1 overlaps with the first part 14, and the first scanning signal line Scan1, the second scanning signal line Scan2 and the second light-emitting control signal sub-line Emit_2 each overlap with the second part 15, to facilitate that the first part 14 and the second part 15 each are connected to the light-emitting control signal line Emit, and thus effectively reducing a voltage drop when the light-emitting control signal is transmitted to the first part 14 and the second part 15.

In the embodiments of the present disclosure, the type-B pixel circuit 11 and the type-A pixel circuit 10 have a same circuit structure, which will not be repeated herein.

Figure 26:
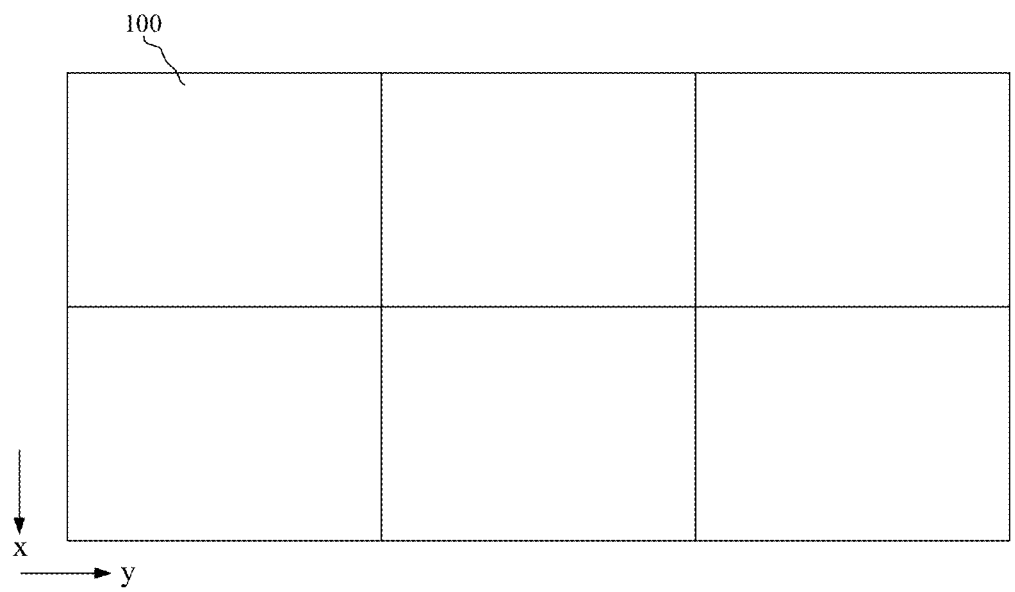
FIG. 26 is a schematic diagram of a spliced display device provided by some embodiments of the present disclosure.

Some embodiments of the present disclosure also provide a spliced display device. FIG. 26 is a schematic diagram of a spliced display device provided by some embodiments of the present disclosure. As shown in FIG. 26, the spliced display device includes multiple display panels 100, and at least two display panels 100 are spliced together along the first direction x.

A structure of the display panel 100 has been described in detail in the above embodiments, and will not be repeated herein. The display device shown in FIG. 26 is only a schematic illustration, and the spliced display device can be, for example, an LED spliced screen, a movie screen, a remote viewing electronics, etc.

The above description merely describes some exemplary embodiments of the present disclosure, and is not intended to limit the present disclosure. Any modification, equivalent replacement, improvement, etc., made within the spirit and principle of the present disclosure shall fall within a scope of the present disclosure.

It should be understood that the embodiments described above are merely intended to illustrate, but not to limit, the technical solutions of the present disclosure. Although the present disclosure is described in detail with reference to the preferred embodiments as above, those skilled in the art can still modify the technical solutions described in the foregoing embodiments, or equivalently replace some or all of the technical features. These modifications or replacements do not deviate the essence of the corresponding technical solutions from the scope of the technical solutions of the present disclosure.

What is claimed is:

1. A display panel, comprising:
   a first panel edge and a second panel edge that are opposite to each other in a first direction;
   pixel rows arranged along the first direction and comprising a type-A pixel row and type-B pixel rows, wherein the type-A pixel row is adjacent to the first panel edge, and the type-B pixel rows comprise a first type-B pixel row adjacent to the type-A pixel row; and
   spacing areas corresponding to the type-B pixel rows in a one-to-one correspondence, wherein one spacing area of the spacing areas is adjacent to one type-B pixel row of the type-B pixel rows corresponding to the one spacing area and is located at a side of the one type-B pixel row close to the first panel edge,
   wherein one pixel row of the pixel rows comprises light-emitting devices and pixel circuits, wherein the light-emitting devices are arranged in a second direction that intersects with the first direction;
   wherein the pixel circuits located in the pixel rows comprise type-A pixel circuits located in the type-A pixel row and type-B pixel circuits located in the type-B pixel rows, and the light-emitting devices located in the pixel rows comprise type-A light-emitting devices located in the type-A pixel row and type-B light-emitting devices located in the type-B pixel rows;
   wherein each of the pixel circuits comprises a first part and a second part;
   wherein, in the type-A pixel row, the first part of each of at least one of the type-A pixel circuits is located at a side of the type-A light-emitting devices close to the first panel edge, and the second part of one of the type-A pixel circuits is located in the one spacing area that corresponds to the first type-B pixel row; and
   wherein, in at least one of the type-B pixel rows, the first part and the second part of each of the type-B pixel circuits is located at a side of one of the type-B light-emitting devices close to the first panel edge.

2. The display panel according to claim 1, wherein, in the type-A pixel row, a size of the first part in the first direction is smaller than a size of the second part in the first direction.

3. The display panel according to claim 1,
   wherein the type-A pixel circuits comprise a first type-A pixel circuit, wherein the first part of the first type-A pixel circuit is located at a side of the type-A light-emitting device close to the first panel edge; and
   wherein a size of the first part of the first type-A pixel circuit in the second direction is greater than a size of the first part of one of the type-B pixel circuits in the second direction, and a size of the first part of the first type-A pixel circuit in the first direction is smaller than a size of the first part of one of the type-B pixel circuits in the first direction.

4. The display panel according to claim 3, wherein one of the pixel rows comprises light-emitting device groups arranged along the second direction, wherein each of the light-emitting device groups comprises at least two light-emitting devices arranged along the second direction, and wherein a distance between two adjacent light-emitting device groups is greater than a distance between two adjacent light-emitting devices in one of the light-emitting device groups; and
wherein the type-A pixel circuits further comprise a second type-A pixel circuit, the first part of the second type-A pixel circuit is located between adjacent light-emitting device groups in the pixel row.

5. The display panel according to claim 1,
wherein the type-A pixel circuits comprises a first type-A pixel circuit, wherein the first part of the first type-A pixel circuit is located at a side of one of the type-A light-emitting devices close to the first panel edge; and
wherein a distance between the first part of the first type-A pixel circuit and one of the type-A light-emitting devices is smaller than a distance between one of the type-B pixel circuits and one of the type-B light-emitting devices.

6. The display panel according to claim 1, further comprising:
a first negative power signal line extending along the second direction; and
a second negative power signal line extending along the first direction,
wherein one of the light-emitting devices comprises an anode and a cathode that are arranged in the first direction;
wherein the first negative power signal line is electrically connected to the cathode, and wherein the first negative power signal line overlaps with the cathode in a direction perpendicular to a plane of the display panel; and
wherein the second negative power signal line is electrically connected to the first negative power signal line and comprises a first line edge and a second line edge that are opposite to each other in the first direction, and wherein the first line edge is close to the first panel edge, and an extension line of the first line edge extending along the second direction is located at a side of the anode of one of the type-A light-emitting devices away from the first panel edge.

7. The display panel according to claim 1, further comprising:
a first positive power signal line extending along the second direction; and
a second positive power signal line extending along the first direction,
wherein the first positive power signal line is electrically connected to the second part and overlaps with the second part in a direction perpendicular to a plane of the display panel; and
wherein the second positive power signal line is electrically connected to the first positive power signal line and comprises a third line edge and a fourth line edge that are opposite to each other in the first direction, and wherein the third line edge is close to the first panel edge, and an extension line of the third line edge extending along the second direction is located at a side of one of the type-A light-emitting devices away from the first panel edge.

8. The display panel according to claim 7,
wherein one of the pixel rows comprises light-emitting device groups arranged along the second direction, wherein one of the light-emitting device groups comprises at least two light-emitting devices arranged along the second direction, and wherein a distance between two adjacent light-emitting device groups of the light-emitting device groups is greater than a distance between two adjacent light-emitting devices in one of the light-emitting device groups;
wherein the second positive power signal line extends between adjacent light-emitting device groups of the light-emitting device groups; and
wherein the display panel further comprises at least one functional module, wherein one of the at least one functional module is located between adjacent light-emitting device groups and is also located between the first panel edge and an extension line of the third line edge extending along the second direction.

9. The display panel according to claim 7,
wherein one of the pixel rows comprises light-emitting device groups arranged along the second direction, one of the light-emitting device groups comprises at least two light-emitting devices arranged along the second direction, and a distance between two adjacent light-emitting device groups of the light-emitting device groups is greater than a distance between two adjacent light-emitting devices in one of the light-emitting device groups;
wherein the second positive power signal line extends between adjacent light-emitting device groups of the light-emitting device groups;
wherein the pixel circuits further comprises a third part;
wherein in the type-A pixel row, the third part of at least one type-A pixel circuit of the type-A pixel circuits is located between two adjacent light-emitting device groups of the light-emitting device groups, and is also located between the first panel edge and an extension line of the third line edge; and
wherein in at least one of the type-B pixel rows, the third part of one of the type-B pixel circuits is located at a side of one of the type-B light-emitting devices close to the first panel edge.

10. The display panel according to claim 1, further comprising cascaded shift register circuits,
wherein the type-B pixel rows further comprise second type-B pixel rows located between the first type-B pixel row and the second panel edge; and
wherein the shift register circuits are located in at least one of the spacing areas corresponding to at least one of the second type-B pixel rows.

11. The display panel according to claim 1, further comprising a signal bus extending along the second direction,
wherein the type-B pixel rows further comprise second type-B pixel rows located between the first type-B pixel row and the second panel edge, and the second type-B pixel rows comprise a second A pixel row adjacent to the second panel edge; and
wherein the signal bus is located at a side of one of the type-B light-emitting devices in the second A pixel row away from the second panel edge.

12. The display panel according to claim 11,
wherein the second part of one type-B pixel circuit of the type-B pixel circuits in the second A pixel row is located at a side of one type-B light-emitting device of the type-B light-emitting devices close to the first panel edge, and the first part of one type-B pixel circuit is located at a side of one type-B light-emitting device close to the second panel edge; and wherein the signal bus is located between the second part in the second A pixel row and one spacing area corresponding to the second A pixel row, and wherein the first part of one of the type-B pixel circuits has a size in the first direction smaller than a total width of the signal bus in the first direction.

13. The display panel according to claim 11,
wherein the type-B pixel rows further comprise second type-B pixel rows located between the first type-B pixel row and the second panel edge; and
wherein the signal bus is located in at least one spacing area that corresponds to at least one of the second type-B pixel rows.

14. The display panel according to claim 13, further comprising cascaded shift register circuits,
wherein the shift register circuits are located in at least one spacing area corresponding to at least one of the second type-B pixel rows; and
wherein at most one signal bus is provided in the spacing area where the shift register circuits are located.

15. The display panel according to claim 13, further comprising cascaded shift register circuits,
wherein the spacing areas comprise a first spacing area and a second spacing area, the shift register circuits are located in the first spacing area, and the signal bus is located in the second spacing area.

16. The display panel according to claim 1, further comprising a data gate circuit,
wherein the type-B pixel rows further comprise second type-B pixel rows located between the first type-B pixel row and the second panel edge, and wherein the second type-B pixel rows comprise a second A pixel row adjacent to the second panel edge, and the data gate circuit is located at a side of one of the type-B light-emitting devices in the second A pixel row away from the second panel edge.

17. The display panel according to claim 16,
wherein in the second A pixel row, the second part of the type-B pixel circuit is located at a side of the type-B light-emitting device close to the first panel edge, and the first part of the type-B pixel circuit is located at a side of the type-B light-emitting device close to the second panel edge; and
wherein the data gate circuit is located between the second part of the second A pixel row and one spacing area corresponding to the second A pixel row, and wherein a size of the first part of the type-B pixel circuit in the first direction is smaller than a size of the data gate circuit in the first direction.

18. The display panel according to claim 1,
wherein the second part of one of the type-A pixel circuits comprises:
a display driver transistor,
a display gate reset module electrically connected to a first scanning signal line, a reset signal line, and a gate of the display driver transistor,
a display anode reset module electrically connected to the first scanning signal line, the reset signal line, and one of the type-A light-emitting devices,
a display data writing module electrically connected to a second scanning signal line, a constant-voltage data line, and a first electrode of the display driver transistor,
a display threshold compensation module electrically connected to the second scanning signal line, a second electrode of the display driver transistor, and the gate of the display driver transistor,
a first display light-emitting control module electrically connected to a second light-emitting control signal line, a first positive power signal line and the first electrode of the display driver transistor,
a second display light-emitting control module electrically connected to the second light-emitting control signal line, the second electrode of the display driver transistor and one of the type-A light-emitting devices, and
a display storage capacitor electrically connected to the first positive power signal line and the gate of the display driver transistor, and wherein the first part of one of the type-A pixel circuits comprises:
a voltage-controlled driver transistor,
a voltage-controlled gate reset module electrically connected to the first scanning signal line, the reset signal line, and a gate of the voltage-controlled driver transistor,
a voltage-controlled data writing module electrically connected to the second scanning signal line, a variable-voltage data line, and a first electrode of the voltage-controlled driver transistor,
a voltage-controlled threshold compensation module electrically connected to the second scanning signal line, a second electrode of the voltage-controlled driver transistor, and the gate of the voltage-controlled driver transistor,
a first voltage-controlled light-emitting control module electrically connected to a first light-emitting control signal line, a voltage-controlled power signal line, and the first electrode of the voltage-controlled driver transistor,
a second voltage-controlled light-emitting control module electrically connected to the first light-emitting control signal line, the second electrode of the voltage-controlled driver transistor, and the gate of the display driver transistor, and
a voltage-controlled storage capacitor electrically connected to a frequency sweeping signal line and the gate of the voltage-controlled driver transistor, wherein the first scanning signal line comprises a first A scanning signal line electrically connected to the first part and a first B scanning signal line electrically connected to the second part;
wherein the second scanning signal line comprises a second A scanning signal line electrically connected to the first part and a second B scanning signal line electrically connected to the second part; and
wherein in a direction perpendicular to a plane of the display panel, the first A scanning signal line and the second A scanning signal line each overlap with the first part, and the first B scanning signal line and the second B scanning signal line each overlap with the second part.

19. The display panel according to claim 1,
wherein the second part of one of the type-A pixel circuits comprises:
a driver transistor,
a gate reset module electrically connected to a first scanning signal line, a reset signal line and a gate of the driver transistor,
an anode reset module electrically connected to the first scanning signal line, the reset signal line and one of the type-A light-emitting devices, a data writing module electrically connected to a second scanning signal line, a data writing data line and a first electrode of the driver transistor, a threshold compensation module electrically connected to the second scanning signal line, a second electrode of the driver transistor and the gate of the driver transistor, a first light-emitting control module electrically connected to a light-emitting control signal line, a first positive power signal line and the first electrode of the driver transistor, and a storage capacitor electrically connected to the first positive power signal line and the gate of the driver transistor; and wherein the first part of one of the type-A pixel circuits comprises:

a second light-emitting control module electrically connected to the light-emitting control signal line, the second electrode of the driver transistor and one of the type-A light-emitting devices, wherein the light-emitting control signal line comprises a first light-emitting control signal sub-line electrically connected to the first light-emitting control module and a second light-emitting control signal sub-line electrically connected to the second light-emitting control module; and wherein in a direction perpendicular to a plane of the display panel, the first light-emitting control signal sub-line overlaps with the first part; and the first scanning signal line, the second scanning signal line and the second light-emitting control signal sub-line each overlap with the second part.

20. A spliced display device, comprising display panels, wherein each of the display panels comprises:

a first panel edge and a second panel edge that are opposite to each other in a first direction;

pixel rows arranged along the first direction and comprising a type-A pixel row and type-B pixel rows, wherein the type-A pixel row is adjacent to the first panel edge, and the type-B pixel rows comprise a first type-B pixel row adjacent to the type-A pixel row; and spacing areas corresponding to the type-B pixel rows in a one-to-one correspondence, wherein one spacing area of the spacing areas is adjacent to one type-B pixel row of the type-B pixel rows corresponding to the one spacing area and is located at a side of the one type-B pixel row close to the first panel edge, wherein one pixel row of the pixel rows comprises light-emitting devices and pixel circuits, wherein the light-emitting devices are arranged in a second direction that intersects with the first direction;

wherein the pixel circuits located in the pixel rows comprise type-A pixel circuits located in the type-A pixel row and type-B pixel circuits located in the type-B pixel rows, and the light-emitting devices located in the pixel rows comprise type-A light-emitting devices located in the type-A pixel row and type-B light-emitting devices located in the type-B pixel rows;

wherein each of the pixel circuits comprises a first part and a second part;

wherein, in the type-A pixel row, the first part of each of at least one of the type-A pixel circuits is located at a side of the type-A light-emitting devices close to the first panel edge, and the second part of one of the type-A pixel circuits is located in one spacing area that corresponds to the first type-B pixel row; and wherein, in at least one of the type-B pixel rows, the first part and the second part of each of the type-B pixel circuits is located at a side of one of the type-B light-emitting devices close to the first panel edge, and wherein at least two of the display panels are spliced together along the first direction.

\* \* \* \* \*